United States Patent
Xiao

(10) Patent No.: US 12,101,924 B2
(45) Date of Patent: Sep. 24, 2024

(54) SEMICONDUCTOR STRUCTURE AND METHOD FOR MANUFACTURING SAME

(71) Applicant: CHANGXIN MEMORY TECHNOLOGIES, INC., Hefei (CN)

(72) Inventor: Deyuan Xiao, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 199 days.

(21) Appl. No.: 17/671,019

(22) Filed: Feb. 14, 2022

(65) Prior Publication Data

US 2023/0009047 A1    Jan. 12, 2023

Related U.S. Application Data

(63) Continuation of application No. PCT/CN2021/120342, filed on Sep. 24, 2021.

(30) Foreign Application Priority Data

Jul. 9, 2021 (CN) .......................... 202110777160.7

(51) Int. Cl.
*H01L 21/00* (2006.01)
*H01L 29/66* (2006.01)
(Continued)

(52) U.S. Cl.
CPC ....... *H10B 12/09* (2023.02); *H01L 29/66742* (2013.01); *H01L 29/78642* (2013.01);
(Continued)

(58) Field of Classification Search
CPC .. H10B 12/09; H10B 12/482; H10B 12/0335; H10B 12/05; H10B 12/50; H10B 12/315; H01L 29/66742; H01L 29/78642
See application file for complete search history.

(56) References Cited

U.S. PATENT DOCUMENTS

| 7,968,876 B2 | 6/2011 | Lung |
| 8,884,363 B2 | 11/2014 | Xiao |

(Continued)

FOREIGN PATENT DOCUMENTS

| CN | 101079434 A | 11/2007 |
| CN | 101908553 A | 12/2010 |

(Continued)

OTHER PUBLICATIONS

D. Xiao, M.Chi, D.Yuan, X.Wang, Y.Yu, H.Wu, and J.Xie, "A novel accumulation mode GAAC FinFET transistor: Device analysis, 3D TCAD simulation and fabrication", ECS Trans., vol. 18, No. 1, pp. 83-88, 2009.

(Continued)

*Primary Examiner* — Richard A Booth
(74) *Attorney, Agent, or Firm* — Kilpatrick Townsend & Stockton LLP

(57) ABSTRACT

A semiconductor structure and a method for manufacturing same. The semiconductor structure includes: a semiconductor base, including a logical device region and a memory region; a bit line located in the memory region and an electrical contact layer located in the logical device region, which are disposed in a same layer; a first semiconductor channel located on the bit line and a second semiconductor channel located on the electrical contact layer, which are disposed in a same layer; a word line and a gate disposed in a same layer; a capacitor structure, in contact with a second doped region of the first semiconductor channel; an electrical connection structure, in contact with the fourth doped region of the second semiconductor channel; and a dielectric layer, located between the bit line and the word line, and on a side of the word line away from the semiconductor base.

20 Claims, 17 Drawing Sheets

(51) Int. Cl.
   *H01L 29/786* (2006.01)
   *H10B 12/00* (2023.01)
(52) U.S. Cl.
   CPC ......... *H10B 12/0335* (2023.02); *H10B 12/05* (2023.02); *H10B 12/315* (2023.02); *H10B 12/482* (2023.02); *H10B 12/50* (2023.02)

(56) References Cited

U.S. PATENT DOCUMENTS

| | | | |
|---|---|---|---|
| 10,964,820 B2 | 3/2021 | Pillarisetty et al. | |
| 2004/0008542 A1 | 1/2004 | Sharma | |
| 2007/0075359 A1 | 4/2007 | Yoon | |
| 2007/0252196 A1 | 11/2007 | Kim | |
| 2010/0295123 A1 | 11/2010 | Lung | |
| 2010/0320521 A1 | 12/2010 | Izumi | |
| 2011/0017971 A1 | 1/2011 | Kim | |
| 2011/0121375 A1 | 5/2011 | Kawahara | |
| 2013/0161832 A1 | 6/2013 | Cho | |
| 2014/0232014 A1 | 8/2014 | Cho et al. | |
| 2014/0291763 A1 | 10/2014 | Van Buskirk et al. | |
| 2016/0197076 A1 | 7/2016 | Kamata | |
| 2018/0069011 A1 | 3/2018 | Colinge et al. | |
| 2018/0331029 A1 | 11/2018 | Sukekawa | |
| 2019/0348540 A1 | 11/2019 | Pillarisetty et al. | |
| 2020/0058584 A1 | 2/2020 | Sukekawa | |
| 2020/0258902 A1* | 8/2020 | Xiao | H10B 43/27 |
| 2021/0193498 A1 | 6/2021 | Or-Bach et al. | |
| 2023/0019891 A1* | 1/2023 | Xiao | H10B 12/033 |
| 2023/0128761 A1* | 4/2023 | Jang | H01L 29/78642 257/296 |

FOREIGN PATENT DOCUMENTS

| | | |
|---|---|---|
| CN | 110024133 A | 7/2019 |
| TW | 201349502 A | 12/2013 |
| TW | 201921648 A | 6/2019 |

OTHER PUBLICATIONS

Xiao DeYuan, et al, "A novel accumulation mode complementary GAAC FinFETs inverter with hybrid orientation SOI substrate", Science Bulletin, 2009, 54(14): 2051-2059, Jan. 8, 2009.

J. P. Colinge, et al., "Nanowire transistors without junctions," Nature Nanotechnology, vol. 5(3), pp. 225-229, Mar. 2010.

P. Singh et al., "Gate-All-Around Junctionless Nanowire MOSFET With Improved Low-Frequency Noise Behavior", IEEE Electron Device Letters, vol. 32, No. 12, Dec. 2011.

Wang Shaodi, "This paper introduces memory and computation integrated chip". Semiconductor Industry Watch, Apr. 11, 2020, <http://www.semiinsights.com/s/electronic_components/23/39006.shtml>.

Supplementary European Search Report in the European application No. 21863080.4, mailed on Oct. 27, 2022, 9 pgs.

First Office Action of the Taiwanese application No. 111123110, issued on Oct. 26, 2022, 4 pgs.

First Office Action of the Japanese application No. 2022-549392, issued on Oct. 24, 2023. 16 pages with English translation.

* cited by examiner

SEMICONDUCTOR STRUCTURE AND METHOD FOR MANUFACTURING SAME

CROSS-REFERENCE TO RELATED APPLICATIONS

The disclosure is a continuation application of International Application No. PCT/CN2021/120342, filed on Sep. 24, 2021, which claims priority to Chinese Patent Application No. 202110777160.7, filed on Jul. 9, 2021. The disclosures of International Application No. PCT/CN2021/120342 and Chinese Patent Application No. 202110777160.7 are hereby incorporated by reference in their entireties.

BACKGROUND

In a von Neumann architecture, a logical control device and a memory are separate units. The logical control device reads data from the memory, and performs corresponding processing on the data and stores the processed data back in the memory. Specifically, data is transferred back and forth between the logical control device and the memory. The memory and the logical control device are respectively located in different chips. The back-and-forth transfer of data between the different chips leads to high power consumption and low performance.

Therefore, it is necessary to design a semiconductor device that can implement In-Memory Computing (IMC).

SUMMARY

The embodiments of the disclosure relate to a semiconductor structure and a method for manufacturing same.

Embodiments of the disclosure provide a semiconductor structure, including: a semiconductor base, including a logical device region and a memory region; a bit line and an electrical contact layer disposed in a same layer as the bit line, the bit line being located on the semiconductor base in the memory region, the electrical contact layer being located on the semiconductor base in the logical device region; a first semiconductor channel, located on a surface of the bit line, in a direction from the semiconductor base to the bit line, the first semiconductor channel including a first doped region, a first channel region, and a second doped region that are sequentially arranged, the first doped region being in contact with the bit line; a second semiconductor channel, disposed in a same layer as the first semiconductor channel, and located on a surface of the electrical contact layer, in a direction from the semiconductor base to the electrical contact layer, the second semiconductor channel including a third doped region, a second channel region, and a fourth doped region that are sequentially arranged, the third doped region being in contact with the electrical contact layer; a word line and a gate disposed in a same layer as the word line, the word line being disposed surrounding the first channel region, the gate being disposed surrounding the second channel region; a capacitor structure, located on a side of the second doped region away from the first channel region, and in contact with the second doped region; an electrical connection structure, located on a side of the fourth doped region away from the second channel region, and in contact with the fourth doped region; and a dielectric layer, located between the bit line and the word line, and further located on a side of the word line away from the semiconductor base.

Correspondingly, embodiments of the disclosure further provide a method for manufacturing a semiconductor structure, including: providing a semiconductor base, the semiconductor base including a logical device region and a memory region; forming a bit line and an electrical contact layer disposed in a same layer as the bit line, the bit line being located on the semiconductor base in the memory region, the electrical contact layer being located on the semiconductor base in the logical device region; forming a first semiconductor channel and a second semiconductor channel disposed in a same layer as the first semiconductor channel, the first semiconductor channel being located on a surface of the bit line, in a direction from the semiconductor base to the bit line, the first semiconductor channel including a first doped region, a first channel region, and a second doped region that are sequentially arranged, the first doped region being in contact with the bit line, the second semiconductor channel being located on a surface of the electrical contact layer, in a direction from the semiconductor base to the electrical contact layer, the second semiconductor channel including a third doped region, a second channel region, and a fourth doped region that are sequentially arranged, the third doped region being in contact with the electrical contact layer; forming a word line and a gate disposed in a same layer as the word line, the word line being disposed surrounding the first channel region, the gate being disposed surrounding the second channel region; forming a capacitor structure, the capacitor structure being located on a side of the second doped region away from the first channel region, the capacitor structure being in contact with the second doped region; forming an electrical connection structure, the electrical connection structure being located on a side of the fourth doped region away from the second channel region, the electrical connection structure being in contact with the fourth doped region; and forming a dielectric layer, the dielectric layer being located between the bit line and the word line, and being further located on a side of the word line away from the semiconductor base.

BRIEF DESCRIPTION OF THE DRAWINGS

One or more embodiments are exemplarily described by using diagrams that corresponds to the one or more embodiments in the accompanying drawings. Unless specifically indicated, the diagrams in the accompanying drawings do not constitute any limitations on proportions.

DETAILED DESCRIPTION

Based on the BACKGROUND, in the related art, while the integration density of semiconductor devices is to be increased, the manufacturing costs are to be reduced.

Based on analysis, a von Neumann architecture is used in a conventional computer. In such an architecture, computing functions and storage functions are separate. A central processing unit (CPU) and a memory communicate with each other through a bus. The CPU reads data from the memory, completes computing, and then writes a result back into the memory. All data is stored in the memory, and is then transferred to the CPU. A computing result from the CPU is then stored in the memory. As can be seen, during the use of a conventional von Neumann architecture, the memory needs to be frequently read and written, the back-and-forth transfer of data causes massive power consumption and device performance degradation.

To resolve the foregoing problem, embodiments of the disclosure provide a semiconductor structure and a method for manufacturing same. In a semiconductor structure, a semiconductor base including a logical device region and a memory region is designed. A structure in the memory region is used for implementing data storage, and a structure in the logical device region is used for implementing data computing, so that one same semiconductor structure is provided with both a processing unit and a memory, to implement IMC, thereby enabling an input/output process and a computing process of data to be performed in different regions of the semiconductor structure. This helps to shorten the distance between the processing unit and the memory, thereby improving the efficiency of data transfer and reducing power consumption required for data transfer. This helps to improve the operating efficiency of the semiconductor structure and reduce the operating energy consumption of the semiconductor structure.

For clearer descriptions of the objectives, technical solutions, and advantages of the embodiments of the disclosure, the embodiments of the disclosure are described in detail hereinafter with reference to the accompanying drawings. However, it is understandable to those of ordinary skill in the art that many technical details are provided for a reader to better understand the disclosure in the embodiments of the disclosure. However, even in the absence of these technical details and various changes and modifications based on the following embodiments, the technical solution claimed in the disclosure may be implemented.

Figure 1:
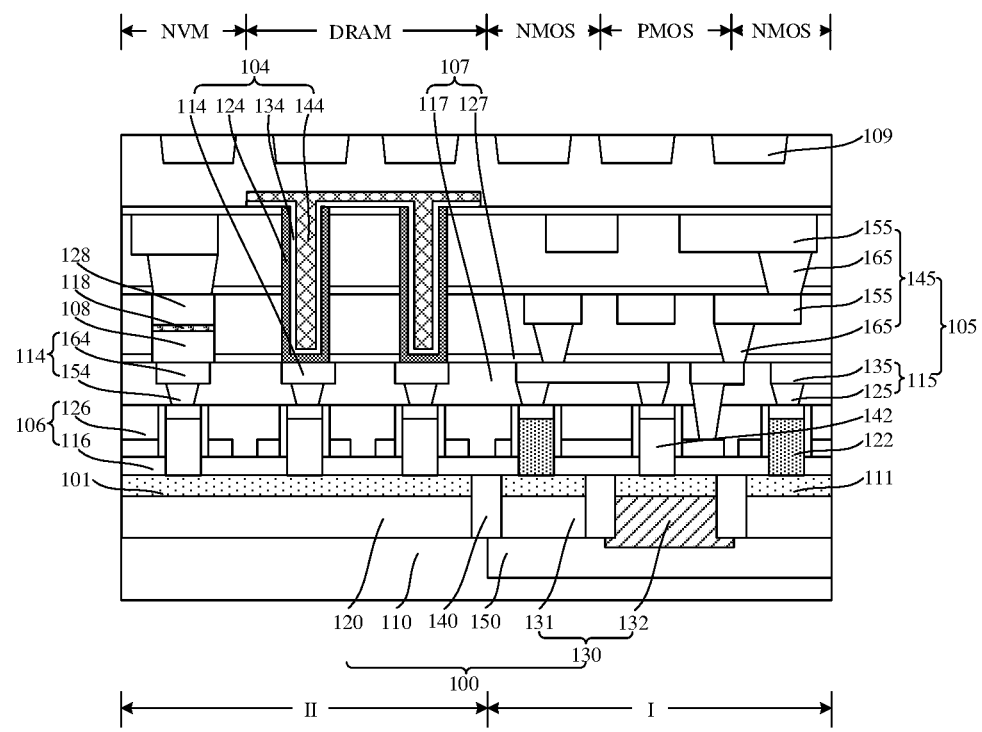
FIG. 1 is a sectional schematic structural diagram corresponding to a semiconductor structure according to an embodiment of the disclosure.
Figure 2:
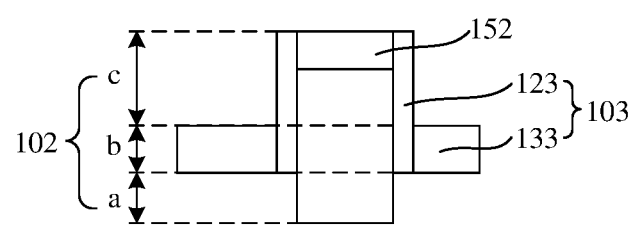
FIG. 2 is an enlarged schematic structural diagram of a first semiconductor channel and a word line in the semiconductor structure shown in FIG. 1.
Figure 3:
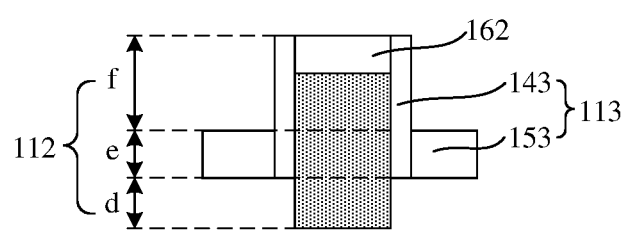
FIG. 3 is an enlarged schematic structural diagram of a second semiconductor channel and a gate in the semiconductor structure shown in FIG. 1.

An embodiment of the disclosure provides a semiconductor structure. The semiconductor structure provided in the embodiment of the disclosure is described below in detail with reference to the accompanying drawings. FIG. 1 is a sectional schematic structural diagram corresponding to a semiconductor structure according to an embodiment of the disclosure. FIG. 2 is an enlarged schematic structural diagram of a first semiconductor channel and a word line in the semiconductor structure shown in FIG. 1. FIG. 3 is an enlarged schematic structural diagram of a second semiconductor channel and a gate in the semiconductor structure shown in FIG. 1.

Referring to FIG. 1 to FIG. 3, the semiconductor structure includes: a semiconductor base 100, including a logical device region I and a memory region II; a bit line 101 and an electrical contact layer 111 disposed in the same layer as the bit line 101, the bit line 101 being located on the semiconductor base 100 in the memory region II, the electrical contact layer 111 being located on the semiconductor base 100 in the logical device region I; a first semiconductor channel 102, located on the surface of the bit line 101, in a direction from the semiconductor base 100 to the bit line 101, the first semiconductor channel 102 including a first doped region a, a first channel region b, and a second doped region c that are sequentially arranged, the first doped region a being in contact with the bit line 101; a second semiconductor channel 112, disposed in the same layer as the first semiconductor channel 102, and located on the surface of the electrical contact layer 111, in a direction from the semiconductor base 100 to the electrical contact layer 111, the second semiconductor channel 112 including a third doped region d, a second channel region e, and a fourth doped region f that are sequentially arranged, the third doped region d being in contact with the electrical contact layer 111; a word line 103 and a gate 113 disposed in the same layer as the word line 103, the word line 103 being disposed surrounding the first channel region b, the gate 113 being disposed surrounding the second channel region e; a capacitor structure 104, located on the side of the second doped region c away from the first channel region b, and in contact with the second doped region c; an electrical connection structure 105, located on the side of the fourth doped region f away from the second channel region e, and in contact with the fourth doped region f; and a dielectric layer 106, located between the bit line 101 and the word line 103, and further located on the side of the word line 103 away from the semiconductor base 100. The semiconductor structure includes vertical Gate-All-Around (GAA) transistors, and the bit line 101 is located between the semiconductor base 100 and the GAA transistors, so that a memory device with 3D stack can be formed. This helps to increase the integration density in the semiconductor structure. In addition, the semiconductor base 100 includes the logical device region I and the memory region II, in which a structure in the memory region II is used for implementing data storage, and a structure in the logical device region I is used for implementing data computing, so that one same semiconductor structure is provided with both a processing unit and a memory, to implement IMC.

The semiconductor structure is described below in further detail with reference to FIG. 1 to FIG. 3.

In this embodiment, the type of the material of the semiconductor base 100 may be an elemental semiconductor material or a crystalline inorganic compound semiconductor material. The elemental semiconductor material may be silicon or germanium. The crystalline inorganic compound semiconductor material may be silicon carbide, silicon germanide, gallium arsenide, indium galliumide or the like.

Specifically, a material type of the first semiconductor channel 102 and a material type of the second semiconductor channel 112 may be both the same as a material type of the semiconductor base 100, that is, are both an elemental semiconductor material or a crystalline inorganic compound semiconductor material.

Further, the bit line 101 and the first semiconductor channel 102 have the same semiconductor element. A resistivity of the bit line 101 is less than resistivity of the first doped region a. The electrical contact layer 111 and the second semiconductor channel 112 have the same semiconductor element. A resistivity of the electrical contact layer 111 is less than a resistivity of the third doped region d.

Because the first semiconductor channel 102 and the bit line 101 have the same semiconductor element, the first semiconductor channel 102 and the bit line 101 are formed by using one same film layer structure, and the film layer structure is formed by a semiconductor element, so that the bit line 101 and the first semiconductor channel 102 are an integral structure, thereby mitigating an interface state defect between the bit line 101 and the first semiconductor channel 102. The electrical contact layer 111 and the second semiconductor channel 112 have the same semiconductor element. The second semiconductor channel 112 and the electrical contact layer 111 are formed by using one same film layer structure, and the film layer structure is formed by a semiconductor element, so that the electrical contact layer 111 and the second semiconductor channel 112 are an integral structure, thereby mitigating an interface state defect between the electrical contact layer 111 and the second semiconductor channel 112. Both above help to improve the performance of the semiconductor structure.

In this embodiment, the first semiconductor channel 102, the bit line 101, the electrical contact layer 111, and the second semiconductor channel 112 all have the same semiconductor element, that is, may all be formed by using one same film layer structure, that is, may all be formed by using one same initial semiconductor base. The bit line 101, the first semiconductor channel 102, the electrical contact layer 111, the second semiconductor channel 112 and the semiconductor base 100 are an integral structure, thereby improving interface performance between the semiconductor base 100 and the bit line 101 and the electrical contact layer 111, between the bit line 101 and the first semiconductor channel 102, and between the electrical contact layer 111 and the second semiconductor channel 112, to mitigate interface state defects between the four, thereby further improving the electrical performance of the semiconductor structure.

In other embodiments, a material of the bit line may be metal, for example, copper, aluminum or tungsten. A material of the electrical contact layer may be metal, for example, copper, aluminum or tungsten.

In this embodiment, the semiconductor base 100 may include: a semiconductor substrate 110; a first semiconductor trap layer 120, disposed on the semiconductor substrate 110 in the memory region II, the bit line 101 being located on the surface of the first semiconductor trap layer 120 away from the semiconductor substrate 110; and a second semiconductor trap layer 130, disposed on the semiconductor substrate 110 in the logical device region I, the electrical contact layer 111 being located on the surface of the second semiconductor trap layer 130 away from the semiconductor substrate 110.

The first semiconductor trap layer 120 is located between the bit line 101 and the semiconductor substrate 110 to help to prevent the bit line 101 from electrical leakage, and the second semiconductor trap layer 130 is located between the electrical contact layer 111 and the semiconductor substrate 110 to help to prevent the electrical contact layer 111 from electrical leakage.

In this embodiment, the semiconductor substrate 110 is a silicon substrate, the first-type ions are N-type ions, and the second-type ions are P-type ions. Specifically, the N-type ions are at least one type of ions of arsenic ions, phosphorus ions, or antimony ions. The P-type ions are at least one type of ions of boron ions, indium ions, or gallium ions. In other embodiments, the semiconductor substrate is a germanium substrate, a germanium silicon substrate or a Group III-V compound semiconductor substrate. A material of the Group III-V compound semiconductor substrate includes at least one of gallium arsenide, indium phosphide or gallium nitride.

Further, an orthographic projection of the first semiconductor trap layer 120 onto the semiconductor substrate 110 may coincide with an orthographic projection of the bit line 101 onto the semiconductor substrate 110. This helps to increase a contact area between the first semiconductor trap layer 120 and the bit line 101, thereby reducing a contact resistance between the first semiconductor trap layer 120 and the bit line 101. In addition, this further helps to increases a volume of the bit line 101, so that a resistance of the bit line 101 is reduced, an RC delay effect is mitigated, and the operating speed of the semiconductor structure is increased.

A logical device corresponding to the logical device region I may include at least one of a Digital Signal Processor (DSP), a Field-Programmable Gate Array (FPGA), a CPU, a graphics processing unit (GPU) or an embedded neural-network processing unit (NPU). A memory corresponding to the memory region II may include at least one of a Static Random Access Memory (SRAM), a Dynamic Random Access Memory (DRAM), a Resistive Random Access Memory (RRAM), a Magnetoresistive Random Access Memory (MRAM) or a Phase Change Random Access Memory (PCRAM). In this case, in the embodiments of the disclosure, a logical device and a memory device can be integrally manufactured in one same chip, to implement real IMC.

In this embodiment, the logical device region I may include NMOS regions and PMOS regions. The semiconductor base 100 in the logical device region I further includes: an isolation structure 140, located between two adjacent ones of second semiconductor trap layers 130, and further located between two adjacent ones of electrical contact layers 111.

The isolation structure 140 is located between two adjacent ones of the second semiconductor trap layers 130 and two adjacent ones of the electrical contact layers 111, to achieve insulation between the adjacent second semiconductor trap layers 130 and insulation between the adjacent electrical contact layers 111. This helps to avoid electrical interference between the adjacent second semiconductor trap layers 130, and avoid electrical interference between the adjacent electrical contact layers 111. In addition, the isolation structures 140 are further located between the first semiconductor trap layer 120 and the second semiconductor trap layer 130, to implement insulation between the first semiconductor trap layer 120 and the second semiconductor trap layer 130. The material of the isolation structure 140 is at least one of silicon nitride, silicon carbon nitride or silicon carbon oxynitride.

Further, the second semiconductor trap layers 130 include third semiconductor trap layers 131 and fourth semiconductor trap layers 132. The third semiconductor trap layers 131 and the fourth semiconductor trap layers 132 are distributed at intervals from each other. The third semiconductor trap layers 131 are doped with first-type ions. The fourth semiconductor trap layers 132 are doped with second-type ions. The second-type ions are different from the first-type ions. The first semiconductor trap layer 120 is also doped with the first-type ions. The first-type ions and the second-type ions are both one of N-type ions or P-type ions. In this embodiment, the first-type ions are N-type ions. The second-type ions are P-type ions. The logical device region I corresponding to the third semiconductor trap layers 131 is the NMOS regions. The logical device region I corresponding to the fourth semiconductor trap layers 132 is the PMOS regions. In other embodiments, the first-type ions may be P-type ions, and the second-type ions may be N-type ions.

It needs to be noted that in FIG. 1, it is taken as an example that the second semiconductor trap layer 130 includes two third semiconductor trap layers 131 and one fourth semiconductor trap layer 132 located between the two third semiconductor trap layers 131 and the second semiconductor trap layer 130 closest to the first semiconductor trap layer 120 is one of the third semiconductor trap layers 131. In fact, the number of the second semiconductor trap layer 130 is not limited in this embodiment, and the type of the second semiconductor trap layer 130 closest to the first semiconductor trap layer 120 is not limited, either. The number of the second semiconductor trap layer(s) can be appropriately set according to an actual electrical requirement, as long as it is satisfied that the third semiconductor trap layers and the fourth semiconductor trap layer(s) are sequentially distributed in an alternate manner. In addition, the second semiconductor trap layer closest to the first semiconductor trap layer may also be the fourth semiconductor trap layer.

The semiconductor base 100 may further include a deep trap layer 150. An orthographic projection of the second semiconductor trap layer 130 onto the semiconductor substrate 110 is located in an orthographic projection of the deep trap layer 150 onto the semiconductor substrate 110. In this embodiment, the deep trap layer 150 is doped with the first-type ions. In other embodiments, the deep trap layer may be doped with the second-type ions.

In other embodiments, the semiconductor base may not include the first semiconductor trap layer and the second semiconductor trap layers. The bit line and the electrical contact layer are both directly located on the semiconductor substrate. The bit line 101, the first semiconductor channel 102, the electrical contact layer 111, and the second semiconductor channel 112 include the same semiconductor element, and are of an integral structure. In an example, the bit line 101, the first semiconductor channel 102, the electrical contact layer 111, and the second semiconductor channel 112 respectively include silicon. In another example, the bit line, the first semiconductor channel, the electrical contact layer, and the second semiconductor channel may respectively include germanium. Alternatively, the bit line, the first semiconductor channel, the electrical contact layer, and the second semiconductor channel respectively include silicon and germanium. Alternatively, the bit line, the first semiconductor channel, the electrical contact layer, and the second semiconductor channel respectively include silicon and carbon. Alternatively, the bit line, the first semiconductor channel, the electrical contact layer, and the second semiconductor channel respectively include arsenic and gallium. Alternatively, the bit line, the first semiconductor channel, the electrical contact layer, and the second semiconductor channel respectively include gallium and indium.

Specifically, the material of the bit line 101 may include a metal semiconductor compound. Compared with a unmetallized semiconductor material, the metal semiconductor compound has a relatively small resistivity. Therefore, compared with the first semiconductor channel 102, the resistivity of the bit line 101 is smaller. This helps to reduce a resistance of the bit line 101 and reduce a contact resistance between the bit line 101 and the first doped region a, thereby further improving the electrical performance of the semiconductor structure.

In addition, the resistivity of the bit line 101 is less than a resistivity of the first semiconductor trap layer 120. Compared with the case of using the semiconductor material as the material of the bit line 101, the metal semiconductor compound is used as the material of the bit line 101, thereby helping to reduce a resistance of the bit line 101.

In some examples, the material of the entire bit line 101 is a metal semiconductor compound. In some other examples, the material of the region of the bit line 101 located right below the first doped region a is a semiconductor material, and the material of the region of the bit line 101 not covered by the first doped region a is a metal semiconductor compound. It may be understood that with continuously decreasing of device sizes or adjustment of manufacturing process parameters, the material in a partial region of the bit line 101 located right below the first doped region a is a semiconductor material, and the material in the other region of the bit line 101 located right below the first doped region a may be a metal semiconductor compound. The "other regions" herein are located on a periphery of the "partial region".

Further, the material of the electrical contact layer 111 is the same as the material of the bit line 101. Therefore, compared with the second semiconductor channel 112, the resistivity of the electrical contact layer 111 is smaller. This helps to reduce the resistance of the electrical contact layer 111 and reduce the contact resistance between each electrical contact layer 111 and each third doped region d, thereby further improving the electrical performance of the semiconductor structure.

In addition, the resistivity of the electrical contact layer 111 is less than the resistivity of the second semiconductor trap layer 130. Compared with the case of using the semiconductor material as the material of the electrical contact layer 111, when the metal semiconductor compound is used as the material of the electrical contact layers 111, the resistivity of the electrical contact layer 111 is smaller. This helps to reduce a resistance of the electrical contact layer 111.

In some examples, the material of each entire electrical contact layer 111 is a metal semiconductor compound. In some other examples, the material in the region of an electrical contact layer 111 located right below the third doped region d is a semiconductor material, and the material in the region of the electrical contact layer 111 not covered by the third doped region d is a metal semiconductor compound. It may be understood that with continuously decreasing device sizes or adjustment of manufacturing process parameters, the material in a partial region of the electrical contact layer 111 located right below the third doped region d is a semiconductor material, and the material in the other region of the electrical contact layer 111 located right below the third doped region d may be a metal semiconductor compound. The "other regions" herein are located on a periphery of the "partial region".

In other embodiments, the material of the bit line and the material of the electrical contact layer may be semiconductor materials. The semiconductor base does not include the first semiconductor trap layer and the second semiconductor trap layer. The bit line and the electrical contact layer are both directly located on the semiconductor substrate.

In other embodiments, the material of the bit line and/or the material the electrical contact layer may be a metal material.

The semiconductor element may include at least one of silicon, carbon, germanium, arsenic, gallium or indium. The metal element in the metal semiconductor compound includes at least one of cobalt, nickel, molybdenum, titanium, tungsten, tantalum or platinum.

Taking silicon being the semiconductor element as an example, the metal semiconductor compound includes at least one of cobalt silicide, nickel silicide, molybdenum silicide, titanium silicide, tungsten silicide, tantalum silicide, or platinum silicide. In addition, the metal semiconductor compound may be further doped with nitrogen.

The semiconductor structure may include a plurality of bit lines 101 arranged at intervals. Each bit line 101 may be in contact with at least one first doped region a. In FIG. 1, it is taken as an example that each bit line 101 is in contact with three first doped regions a. The number of the first doped regions a in contact with each bit line 101 can be appropriately set according to an actual electrical requirement.

The material of the first semiconductor channel 102 and the material of the second semiconductor channel 112 include an elemental semiconductor material or a crystalline inorganic compound semiconductor. In this embodiment, the material of the first semiconductor channel 102 and the material of the second semiconductor channel 112 are silicon. In other embodiments, the material of the first semiconductor channel and/or the material of the second semiconductor channel may be germanium, silicon germanide, silicon carbide, gallium arsenide or indium galliumide.

Further, the first semiconductor channel 102 and the bit line 101 have the same type of doped ions. The doped ions may be N-type ions or P-type ions. The second semiconductor channel 112 includes a third semiconductor channel 122 and a fourth semiconductor channel 142. The third semiconductor channel 122 is located on the side of one of the third semiconductor trap layer 131 away from the semiconductor substrate 110. The fourth semiconductor channel 142 is located on the side of the fourth semiconductor trap layer 132 away from the semiconductor substrate 110. The type of doped ions doped in the third semiconductor channel 122 is different from the type of doped ions doped in the third semiconductor trap layer 131. The type of doped ions doped in the fourth semiconductor channel 142 is different from a type of doped ions doped in the fourth semiconductor trap layer 132.

In this embodiment, the first semiconductor channel 102 and the second semiconductor channel 112 respectively have a cylindrical structure. Sidewalls of the first semiconductor channel 102 and the second semiconductor channel 112 are both smooth transition surfaces. This helps to prevent the phenomenon of point discharge or electrical leakage from occurring at the first semiconductor channel 102 and the second semiconductor channel 112, thereby further improving the electrical performance of the semiconductor structure. It needs to be noted that in other embodiments, the first semiconductor channel and/or the second semiconductor channel may have an elliptical column structure, a square column structure or other irregular structure. It should be understood that when the structure of the first semiconductor channel and/or the structure of the second semiconductor channel is a square column structure, the corners formed by adjacent surfaces of the sidewalls of the square column structure may be rounded corners, so that the point discharge problem can also be avoided. The square column structure may be a cube column structure or a rectangular column structure.

The first doped region a forms one of the source and the drain of a transistor device, and the second doped region c forms the other one of the source and the drain of the transistor device. The third doped region d forms one of the source and the drain of another transistor device, and the fourth doped region f forms the other one of the source and the drain of the transistor device.

The second doped region c may further include a first metal contact layer 152. The first metal contact layer 152 is in contact with a capacitor structure 104. The material of the first metal contact layer 152 is also a metal semiconductor compound. That is, the material of the first metal contact layer 152 may be the same as the material of the bit line 101. A resistivity of the first metal contact layer 152 is less than the resistivity of the second doped region c other than the first metal contact layer 152. This helps to reduce the resistivity of the second doped region c. In addition, the first metal contact layer 152 helps to reduce the contact resistance between the second doped region c and the capacitor structure 104. It needs to be noted that "the materials are same" herein actually refers to that the materials without considering N-type doped ions or P-type doped ions are same. For example, the material of the first metal contact layer 152 and the material of the bit line 101 are both nickel silicide.

The fourth doped region f may further include a second metal contact layer 162. The second metal contact layer 162 is located in the same layer as the first metal contact layer 152, and is in contact with the electrical connection structure 105. The material of the second metal contact layer 162 is also a metal semiconductor compound. That is, the material of the second metal contact layer 162 may be the same as the material of the electrical contact layer 111. A resistivity of the second metal contact layer 162 is less than a resistivity of the fourth doped region f other than the second metal contact layer 162. This helps to reduce the resistivity of the fourth doped region f. In addition, the second metal contact layer 162 helps to reduce contact resistance between the fourth doped region f and the electrical connection structure 105. It needs to be noted that "the same materials" herein actually refers to that materials without considering N-type doped ions or P-type doped ions are the same. For example, the material of the second metal contact layer 162 and the material of the electrical contact layer 111 are both nickel silicide.

The first semiconductor channel 102 and the second semiconductor channel 112 may constitute the channel of a junctionless transistor, respectively. That is, the first doped region a, the first channel region b, and the second doped region c have the same type of doped ions. The third doped region d, the second channel region e, and the fourth doped region f have the same type of doped ions. For example, the doped ions are all N-type ions or P-type ions. Further, the first doped region a, the first channel region b, and the second doped region c may have the same doped ions. The third doped region d, the second channel region e, and the fourth doped region f may have the same doped ions. Further, doped ions in regions of the first semiconductor channel 102 and the second semiconductor channel 112 may be of the same type. This helps to form the first semiconductor channel 102 and the second semiconductor channel 112 by using one same process step.

"Junctionless" herein refers to that there is no PN junction. That is, there is no PN junction in devices composed of the first semiconductor channel 102 and the second semiconductor channel 112. The benefits of this are as follows. In one aspect, the first doped region a, the second doped region c, the third doped region d, and the fourth doped region f do not need to be additionally doped, thereby avoiding the problem that it is difficult to control doping processes of the first doped region a, the second doped region c, the third doped region d and the fourth doped region f. Especially, as a transistor size further decreases, when the first doped region a, the second doped region c, the third doped region d, and the fourth doped region f are to be additionally doped, it is more difficult to control a doping concentration. In another aspect, since a device is a junctionless transistor, this helps to avoid fabricating a hyperabrupt PN junction within a nanoscale range by using a hyperabrupt source-drain concentration gradient doping process. Therefore, problems such as a threshold voltage drift and a leakage current increase caused by an abrupt doping change can be avoided. This also helps to inhibit a short channel effect and the device can still operate within a scale range of several nanometers. Therefore, this helps to further improve the integration density and electrical performance of the semiconductor structure. Additional doping herein refers to the doping for enabling the type of doped ions in the first doped region a and the second doped region c to be different from the type of doped ions in the first channel region b, and the doping for enabling the type of doped ions in the third doped region d and the fourth doped region f to be different from the type of doped ions in the second channel region e.

Each word line 103 includes: a first gate dielectric layer 123, disposed surrounding the first channel region b, located on the sidewall surface of the first semiconductor channel 102 in which the first channel region b is located, and further located on the sidewall surface of the first semiconductor channel 102 in which the second doped region c is located; and a first gate conductive layer 133, disposed surrounding the first channel region b, and located on the sidewall surface of the first gate dielectric layer 123 corresponding to the first channel region b.

The first gate dielectric layer 123 is used for isolating the first gate conductive layer 133 from the first semiconductor channel 102. In addition, the first gate dielectric layer 123 is located on the sidewall surface of the first semiconductor channel 102 in which the second doped region c is located, protecting the surface of the second doped region c and avoiding process damage to the surface of the second doped region c in a manufacturing process. This helps to further improve the electrical performance of the semiconductor structure. In other embodiments, the first gate dielectric layer may be only located on the sidewall surface of the first semiconductor channel in which the first channel region is located.

The gate 113 includes: a second gate dielectric layer 143, located in the same layer as the first gate dielectric layer 123, disposed surrounding the second channel region e, located on the sidewall surface of the second semiconductor channel 112 in which the second channel region e is located, and further located on the sidewall surface of the second semiconductor channel 112 in which the fourth doped region f is located; and a second gate conductive layer 153, located in the same layer as the first gate conductive layer 133, disposed surrounding the second channel region e, and located on the sidewall surface of the second gate dielectric layer 143 corresponding to the second channel region e.

The second gate dielectric layer 143 is used for isolating the second gate conductive layer 153 from the second semiconductor channel 112. In addition, the second gate dielectric layer 143 is located on the sidewall surface of the second semiconductor channel 112 in which the fourth doped region f is located, protecting the surface of the fourth doped region f and avoiding process damage to the surface of the fourth doped region f in a manufacturing process. This helps to further improve the electrical performance of the semiconductor structure. In other embodiments, the second gate dielectric layer may be only located on the sidewall surface of the second semiconductor channel in which the second channel region is located.

The material of the first gate dielectric layer 123 and the material of the second gate dielectric layer 143 both include at least one of silicon oxide, silicon nitride or silicon oxynitride. The material of the first gate conductive layer 133 and the material of the second gate conductive layer 153 both include at least one of polycrystalline silicon, titanium nitride, tantalum nitride, copper, tungsten or aluminum. In some examples, the material of the first gate dielectric layer 123 and the material of the second gate dielectric layer 143 are the same. This helps to form the first gate dielectric layer 123 and the second gate dielectric layer 143 by one same process step. The material of the first gate conductive layer 133 and the material of the second gate conductive layer 153 are the same. This helps to form the first gate conductive layer 133 and the second gate conductive layer 153 by one same process step.

In this embodiment, the semiconductor structure includes a plurality of bit lines 101 arranged at intervals and a plurality of electrical contact layers 111 arranged at intervals. Each bit line 101 and each electrical contact layer 111 extend in a first direction. Correspondingly, the semiconductor structure includes a plurality of word lines 103 arranged at intervals and a plurality of gates 113 arranged at intervals. Each word line 103 and each gate 113 extend in a second direction. The second direction is different from the first direction. For example, the first direction may be perpendicular to the second direction. In addition, for each word line 103, it may be disposed surrounding the first channel region b of at least one first semiconductor channel 102. For each gate 113, it may be disposed surrounding the second channel region e of at least one second semiconductor channel 112. The number of the first semiconductor channels 102 surrounded by each word line 103 and the number of the second semiconductor channels 112 surrounded by each gate 113 can be appropriately set according to an actual electrical requirement.

FIG. 1 illustrates that a second gate conductive layer 153 surrounds both the third semiconductor channel 122 in the NMOS region and the fourth semiconductor channel 142 in the PMOS region adjacent to the NMOS region. In another example, one second gate conductive layer may only surround the third semiconductor channel in the NMOS region, and another second gate conductive layer may only surround the fourth semiconductor channel in the PMOS region, The dielectric layer 106 is used for isolating the bit line 101 from the first gate conductive layer 133, is further used for isolating the electrical contact layer 111 from the second gate conductive layer 153, and is further used for isolating adjacent word lines 103 and adjacent gates 113. That is, the dielectric layer 106 is located between the bit lines 101 and the word lines 103, is also located in intervals between the adjacent word lines 103, is further located between the electrical contact layers 111 and the gates 113, and is also located in intervals between the adjacent gates 113.

The dielectric layer 106 may include: a first dielectric layer 116, located between the bit lines 101 and the word lines 103 and located between the electrical contact layers 111 and the gates 113, to implement insulation between the bit lines 101 and the word lines 103 and insulation between the electrical contact layers 111 and the gates 113, thereby preventing electrical interference between the bit lines 101 and the word lines 103 and between the electrical contact layers 111 and the gates 113; and a second dielectric layer 126, located between adjacent word lines 103 and between adjacent gates 113, in contact with the first dielectric layer 116, and used for implement insulation between the adjacent word lines 103 and between the adjacent gates 113, thereby preventing electrical interference between the adjacent word lines 103 and between the adjacent gates 113. The second dielectric layer 126 is further located on surfaces of the word lines 103 and the gates 113 away from the semiconductor base 100, and is used for supporting other conductive structures located on the surface of the second dielectric layer 126 away from the semiconductor base 100 and insulating the word lines 103 and the gates 113 from other conductive structures.

In this embodiment, the material of the first dielectric layer 116 and the material of the second dielectric layer 126 are the same, and may both be at least one of silicon oxide, silicon nitride, silicon carbon oxynitride or silicon oxynitride. In other embodiments, the material of the first dielectric layer and the material of the second dielectric layer may be different.

It may be understood that in other embodiments, the dielectric layer may has other stacked film layer structure. A specific structure of the stacked film layer structure is related to processes of a manufacturing method, as long as it is ensured that the dielectric layer can achieve isolation.

In this embodiment, the memory region II includes a DRAM region. The capacitor structure 104 of the DRAM region includes: a first conductive structure 114, in contact with the second doped region c; a lower electrode layer 124, in contact with the first conductive structure 114; a capacitor dielectric layer 134, located on the surface of the lower electrode layer 124; and an upper electrode layer 144, located on the surface of the capacitor dielectric layer 134.

Specifically, the first conductive structure 114 includes a first conductive column 154 and a first conductive layer 164. In a plane perpendicular to the surface of the semiconductor base 100, a cross-sectional shape of the first conductive column 154 is an inverted trapezoid with a decreasing width from top to bottom. An orthographic projection of the first conductive layer 164 onto the semiconductor base 100 covers an orthographic projection of the first conductive column 154 onto the semiconductor base 100. This is beneficial for ensuring a relatively large contact area between the first conductive column 154 and the second doped region c and a relatively large contact area between the first conductive layer 164 and the lower electrode layer 124. Meanwhile, this is beneficial for increasing the volume of the first conductive structure 114 and reducing a resistance of the first conductive structure 114. In some examples, the material of the first conductive column 154 and the material of the first conductive layer 164 are the same, and are both at least one of conductive materials such as nickel-platinum, titanium, tantalum, cobalt, polycrystalline silicon, copper, tungsten, tantalum nitride, titanium nitride or ruthenium. In other embodiments, the material of the first conductive column may be different from the material of the first conductive layer.

The material of the lower electrode layer 124 may be the same as the material of the upper electrode layer 144. Both materials of the lower electrode layer 124 and the upper electrode layer 144 may be at least one of nickel-platinum, titanium, tantalum, cobalt, polycrystalline silicon, copper, tungsten, tantalum nitride, titanium nitride or ruthenium. In other embodiments, the material of the lower electrode layer may be different from the material of the upper electrode layer. The material of the capacitor dielectric layer 134 includes a high dielectric constant material such as silicon oxide, tantalum oxide, hafnium oxide, zirconium oxide, niobium oxide, titanium oxide, barium oxide, strontium oxide, yttrium oxide, lanthanum oxide, praseodymium oxide, barium strontium titanate or the like.

In this embodiment, in the plane perpendicular to the surface of the semiconductor base 100, the cross-sectional shape of the lower electrode layer 124 is a U shape. The capacitor dielectric layer 134 located on the surface of the lower electrode layer 124 defines one through via. The upper electrode layer 144 fills the through via. Upper electrode layers 144 located between adjacent through vias are in contact with and electrically connected to each other. That is, the upper electrode layers 144 are of an integral structure. In other embodiments, there is an interval between two upper electrode layers located respectively in two adjacent through vias, so that adjacent upper electrode layers may be connected to different potentials. This helps to achieve diversified control of adjacent capacitor structures.

In other embodiments, the capacitor structure may be a planar capacitor. The lower electrode layer is in contact with the side of the second doped region away from the first channel region. The capacitor dielectric layer is in contact with the side of the lower electrode layer away from the second doped region. The upper electrode layer is in contact with the side of the capacitor dielectric layer away from the lower electrode layer.

In this embodiment, each first semiconductor channel 102 has a cylindrical structure. An end surface of the cylindrical structure, that is, an end surface of the first doped region a, is in contact with the bit line 101. Another end surface of the cylindrical structure, that is, the second doped region c, is in contact with the capacitor structure 104. Further, the second doped region c includes the first metal contact layer 152. The first metal contact layer 152 is in contact with the lower electrode layer 124, to help to reduce a contact resistance between the second doped region c and the lower electrode layer 124, thereby improving the electrical performance of the semiconductor structure.

The electrical connection structure 105 includes: a second conductive structure 115, located in the same layer as the first conductive structure 114, and being in contact with the fourth doped region f, and a third conductive structure 145, in contact with the side of the second conductive structure 115 away from the fourth doped region f.

Specifically, the second conductive structure 115 includes a second conductive column 125 and a second conductive layer 135. FIG. 1 illustrates that one second conductive structure 115 may include one second conductive layer 135 and two second conductive columns 125. The two second conductive columns 125 are respectively in contact with two adjacent fourth doped regions f. That is, one second conductive structure 115 may be electrically connected to the two adjacent fourth doped regions f. Another second conductive structure 115 may include one second conductive layer 135 and one second conductive column 125, and the second conductive column 125 is electrically connected to one fourth doped region f. Still another second conductive structure 115 may include one second conductive layer 135 and one second conductive column 125, and the second conductive column 125 is electrically connected to the second gate conductive layer 153. In this embodiment, the number of second conductive columns 125 and the number of the second conductive layers 135 included in a single second conductive structure 115 and a specific mode of electrical connection of the second conductive column 125 can be appropriately set according to an actual electrical requirement.

In addition, for morphological features and material properties of the second conductive column 125 and the second conductive layer 135 in the second conductive structure 115, reference may be made to the foregoing first conductive structure 114. Details are not described herein again.

The third conductive structure 145 includes at least two layers of third conductive layers 155, one layer of third conductive columns 165 electrically connecting adjacent third conductive layers 155, and another layer of third conductive columns 165 further electrically connecting the second conductive structure 115 and the third conductive layer 155 closest to the second conductive structure 115. In FIG. 1, it is taken as an example that the third conductive structure 145 includes two layers of the third conductive layers 155 and two layers of the third conductive columns 165. The number of layers of third conductive layers 155 and the third conductive columns 165 included in the third conductive structure 145 can be appropriately set according to an actual electrical requirement.

In addition, for morphological features and material properties of the third conductive layer 155 and the third conductive column 165 in the third conductive structure 145, reference may be made to the foregoing first conductive structure 114. Details are not described herein again.

In this embodiment, in the direction perpendicular to the surface of the semiconductor base 100, the depth of the lower electrode layer 124 is the same as the depth of the third conductive structure 145. In FIG. 1, it is taken as an example that the depth of the lower electrode layer 124 penetrates two third conductive layers 155. The number of layers of the third conductive layers 155 penetrated by the depth of the lower electrode layer 124 can be appropriately set according to an actual electrical requirement.

The memory region II may further include a non-volatile memory (NVM) region. Thus, the semiconductor structure may further includes: a free layer 108, a tunneling layer 118 and a pinned layer 128 stacked on a second doped region c in the NVM region. The free layer 108 is electrically connected to the second doped region c of the NVM region. Specifically, a first conductive structure 114 is further provided between the free layer 108 and the second doped region c of the NVM region, and the free layer 108 is electrically connected to the second doped region c by the first conductive structure 114.

Various conductive structures located in the NVM region form an NVM, and various conductive structures located in the DRAM region form a DRAM. The NVM region and the DRAM region form the memory region II, used for storing data. Various conductive structures located in the NMOS region and the PMOS region in the logical device region I form a processing unit, used for performing logical operation on data. In this way, one same semiconductor structure is provided with both a processing unit and a memory, to implement IMC, to enable an input/output process and a computing process of data to be performed in different regions of the semiconductor structure. This helps to shorten the distance between the processing unit and the memory, thereby improving the efficiency of data transfer and reducing power consumption required for data transfer. Therefore, this helps to improve the operating efficiency of the semiconductor structure and reduce the operating energy consumption of the semiconductor structure.

The semiconductor structure further includes: an insulating layer 107, located on the surface of the dielectric layer 106. The capacitor structure 104 and the electrical connection structure 105 are located in the insulating layer 107. A relative dielectric constant of the material of the insulating layer 107 is less than a relative dielectric constant of the material of the dielectric layer 106.

Specifically, the insulating layer 107 may include multiple interlayer dielectric layers 117 and multiple etching barrier layers 127. An interlayer dielectric layer 117 and an etching barrier layer 127 are sequentially stacked. The part of the insulating layer 107 in contact with the surface of the dielectric layer 106 is an interlayer dielectric layer 117. It may be understood that in other embodiments, the insulating layer may has other stacked film layer structure. A specific structure of the stacked film layer structure is related to operations of a manufacturing process, as long as it is ensured that the insulating layer can achieve isolation.

In this embodiment, the semiconductor structure may further include multiple fourth conductive layers 109 that are located on the uppermost layer and are spaced from each other. The fourth conductive layers 109 are used for being electrically connected to a corresponding conductive layer or external device. In this embodiment, it is taken as an example that there are four conductive layers. There may be three, five or any number of conductive layers according to an actual circuit requirement.

In summary, the semiconductor base 100 includes the logical device region I and the memory region II. A structure in the memory region II is used for implementing data storage, and a structure in the logical device region I is used for implementing data computing, so that one same semiconductor structure is provided with both a processing unit and a memory, to implement IMC, thereby enabling an input/output process and a computing process of data to be performed in different regions of the semiconductor structure. This helps to shorten the distance between the processing unit and the memory, thereby improving the efficiency of data transfer and reducing power consumption required for data transfer. This helps to improve the operating efficiency of the semiconductor structure and reduce the operating energy consumption of the semiconductor structure.

In addition, the semiconductor structure provided in this embodiment may be applied to a $4F^2$ memory. F is a feature size. The memory may be a DRAM or an SRAM.

Correspondingly, still another embodiment of the disclosure provides a method for manufacturing a semiconductor structure, which may be used for forming the foregoing semiconductor structure.

FIG. 4 to FIG. 17 are sectional schematic structural diagrams corresponding to operations in a method for manufacturing a semiconductor structure according to still another embodiment of the disclosure. The method for manufacturing a semiconductor structure provided in this embodiment is described below in detail with reference to the accompanying drawings. Parts that are the same as or correspond to the foregoing embodiments are not described below in detail again.

Referring to FIG. 4 to FIG. 9, a semiconductor base 100 is provided. The semiconductor base 100 includes a logical device region I and a memory region II. A bit line 101 and an electrical contact layer 111 disposed in the same layer as the bit line 101 are formed. The bit line 101 is located on the semiconductor base 100 in the memory region II. The electrical contact layer 111 is located on the semiconductor base 100 in the logical device region I. A first semiconductor channel 102 and a second semiconductor channel 112 disposed in the same layer as the first semiconductor channel 102 are formed. The first semiconductor channel 102 is located on the surface of the bit line 101. In a direction from the semiconductor base 100 to the bit line 101, the first semiconductor channel 102 includes a first doped region a, a first channel region b, and a second doped region c that are sequentially arranged. The first doped region a is in contact with the bit line 101. The second semiconductor channel 112 is located on the surface of the electrical contact layer 111. In a direction from the semiconductor base 100 to the electrical contact layer 111, the second semiconductor channel 112 includes a third doped region d, a second channel region e, and a fourth doped region f that are sequentially arranged. The third doped region d is in contact with the electrical contact layer 111.

Specifically, the providing the semiconductor base 100 and forming the bit line 101, the electrical contact layer 111, the first semiconductor channel 102, and the second semiconductor channel 112 includes the following process operations.

Figure 4:
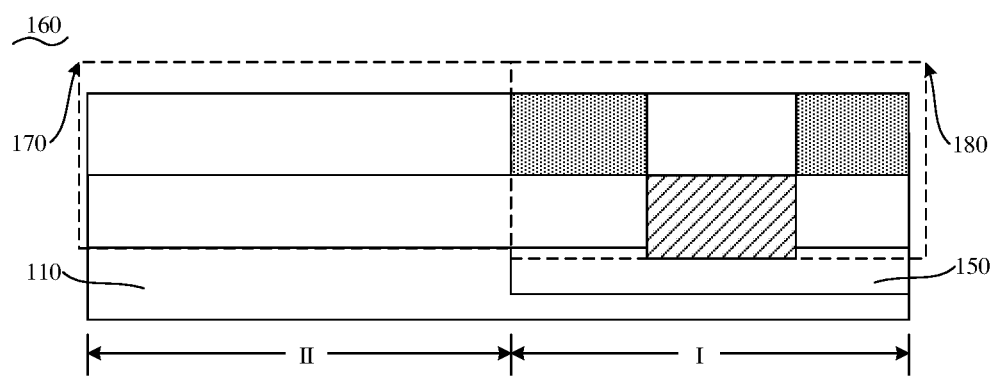
FIG. 4 to FIG. 17 are sectional schematic structural diagrams corresponding to operations in a method for manufacturing a semiconductor structure according to another embodiment of the disclosure.

Referring to FIG. 4, an initial semiconductor base 160 is provided.

The initial semiconductor base 160 is used as a basis for forming the semiconductor base 100, the bit line 101, the electrical contact layer 111, the first semiconductor channel 102, and the second semiconductor channel 112.

In some embodiments, the initial semiconductor base 160 includes a semiconductor substrate 110, an initial first semiconductor trap layer 170, and initial second semiconductor trap layer 180. The initial first semiconductor trap layer 170 is located on the semiconductor substrate 110 in the memory region II. The initial second semiconductor trap layer 180 is located on the semiconductor substrate 110 in the logical device region I.

Specifically, the initial first semiconductor trap layer 170 is a two-layer structure. The initial first semiconductor trap layer 170 is doped with first-type ions. Doping concentrations of first-type ions in different layers are different. A relationship between doping concentrations of first-type ions in different layers is not limited in this embodiment.

The initial second semiconductor trap layer 180 is also of a two-layer structure. Partial regions of the initial second semiconductor trap layer 180 located in the same layer are doped with first-type ions. Partial regions are doped with second-type ions. The regions doped with the first-type ions and the regions doped with the second-type ions are distributed in a staggered manner. In a direction perpendicular to the surface of the semiconductor substrate 110, doped ions in the initial second semiconductor trap layer 180 in adjacent layers are of different types.

In addition, the initial semiconductor base 160 may further include a deep trap layer 150. An orthographic projection of the initial second semiconductor trap layer 180 onto the semiconductor substrate 110 is located in an orthographic projection of the deep trap layer 150 onto the semiconductor substrate 110. In this embodiment, the deep trap layer 150 is doped with the first-type ions. In other embodiments, the deep trap layer may be doped with the second-type ions.

In this embodiment, the semiconductor substrate 110 is a silicon substrate. The first-type ions are N-type ions. The second-type ions are P-type ions. In other embodiments, the semiconductor substrate may be a germanium substrate, a germanium silicon substrate or a Group III-V compound semiconductor substrate. The first-type ions may be P-type ions. The second-type ions may be N-type ions.

Figure 5:
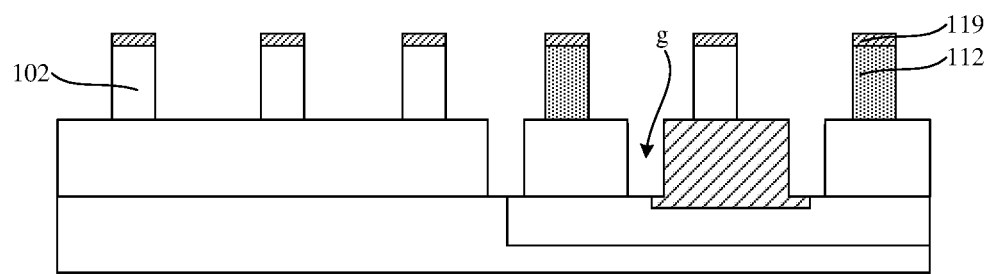

Referring to FIG. 4 and FIG. 5 in combination, a partial thickness of the initial semiconductor base 160 is patterned by using a mask layer 119 as a mask, to form a first semiconductor channel 102 and a second semiconductor channel 112.

In this embodiment, a partial thickness of the initial first semiconductor trap layer 170 and a partial thickness of the initial second semiconductor trap layer 180 are patterned, to form the first semiconductor channel 102 and the second semiconductor channel 112. The remaining partial thickness of the initial first semiconductor trap layer 170 is used for subsequently forming the bit line 101. The remaining partial thickness of the initial second semiconductor trap layer 180 is used for subsequently forming the electrical contact layer 111. A patterning method includes a self-aligned quadruple exposure technique or a self-aligned quadruple imaging technique.

Referring to FIG. 2, the first semiconductor channel 102 includes the first doped region a, the first channel region b, and the second doped region c that are sequentially arranged. Referring to FIG. 3, the second semiconductor channel 112 includes the third doped region d, the second channel region e, and the fourth doped region f that are sequentially arranged.

That is, the first doped region a, the first channel region b, and the second doped region c have the same type of doped ions. The third doped region d, the second channel region e, and the fourth doped region f have the same type of doped ions. The first semiconductor channel 102 and the second semiconductor channel 112 are both used for forming channels of junctionless transistors. Problems such as a threshold voltage drift and a leakage current increase caused by an abrupt doping change are avoided. This also helps to inhibit a short channel effect.

The initial semiconductor base 160 may be doped in respective regions in advance before patterning. The doping may be doping with N-type ions or P-type ions. A partial thickness of the initial semiconductor base 160 may be doped after patterning, to form the first semiconductor channel 102 and the second semiconductor channel 112 with appropriate ion distribution. In this embodiment, corner-rounding may be performed on the first semiconductor channel 102 and/or the second semiconductor channel 112 by thermal oxidation, etching and/or hydrogen annealing, to form the first semiconductor channel 102 and/or the second semiconductor channel 112 with a cylindrical structure. During operation of the semiconductor structure, this helps to prevent a phenomenon of point discharge or electrical leakage from occurring at the first semiconductor channel 102 and/or the second semiconductor channel 112.

Continuing to refer to FIG. 5, the remaining initial second semiconductor trap layer 180 is patterned again (referring to FIG. 4), to form groove g, at a boundary between two adjacent regions doped with different types of ions in the initial second semiconductor trap layer 180. The groove g penetrates the thickness of the remaining initial second semiconductor trap layer 180.

Figure 6:
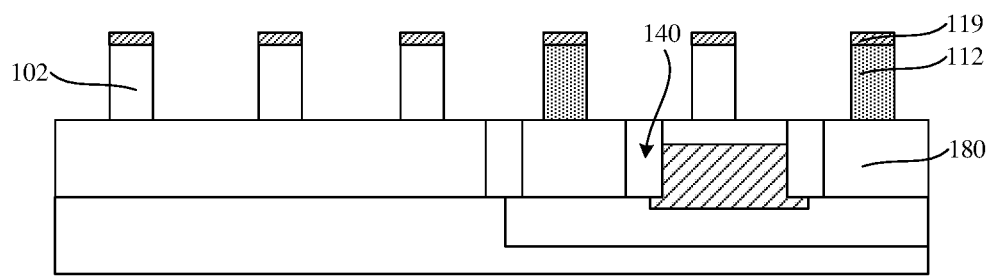

Referring to FIG. 6, an isolation structure 140 is formed in the groove g (referring to FIG. 5). Subsequently, when metal contact layers and second semiconductor trap layers are formed on the basis of the remaining initial second semiconductor trap layer 180, the isolation structure 140 helps to isolate adjacent metal contact layers and isolate adjacent second semiconductor trap layers.

The top surface of the isolation structure 140 may be flush with the top surface of the remaining initial second semiconductor trap layer 180.

Figure 7:
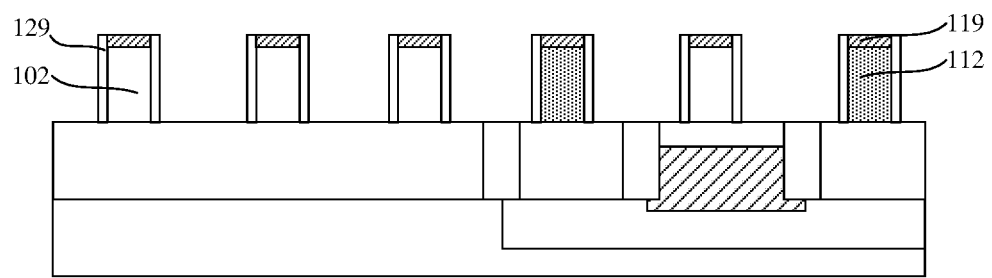
Figure 8:
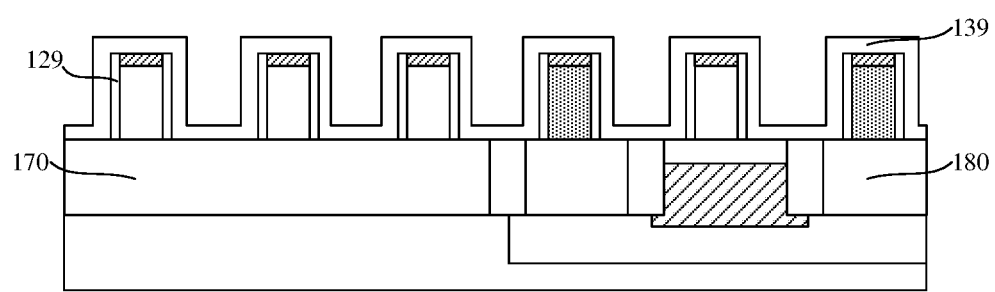
Figure 9:
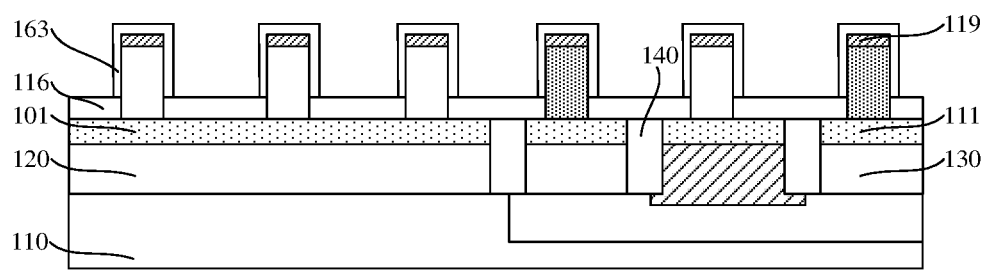

Referring to FIG. 7 to FIG. 9, the remaining partial thickness of the initial semiconductor base 160 (referring to FIG. 4) is metallized, to convert a partial thickness of the initial semiconductor base 160 located below the first semiconductor channel 102 into the bit line 101 and convert a partial thickness of the initial semiconductor base 160 located below the second semiconductor channel 112 into the electrical contact layer 111, and the remaining initial semiconductor base 160 is used as the semiconductor base 100.

Specifically, the remaining partial thickness of the initial first semiconductor trap layer 170 and the partial thickness of the initial second semiconductor trap layer 180 are metallized, to convert the partial thickness of the initial first semiconductor trap layer 170 located below the first semiconductor channel 102 into the bit line 101 and convert the partial thickness of the initial second semiconductor trap layer 180 located below the second semiconductor channel 112 into the electrical contact layer 111. After metallization, the remaining initial first semiconductor trap layer 170 is used as a first semiconductor trap layer 120, and the remaining initial second semiconductor trap layer 180 is used as a second semiconductor trap layer 130.

In other embodiments, the remaining partial thickness of the initial first semiconductor trap layer and partial thickness of the initial second semiconductor trap layer are metallized. A complete thickness of the initial first semiconductor trap layer located below the first semiconductor channel may be converted into the bit line, and a complete thickness of the initial second semiconductor trap layer located below the second semiconductor channel may be converted into the electrical contact layer.

Specifically, the metallization includes the following operations.

Referring to FIG. 7, a barrier layer 129 is formed. The barrier layer 129 covers sidewall surfaces of the first semiconductor channel 102 and the second semiconductor channel 112.

The barrier layer 129 exposes the surface of the initial first semiconductor trap layer 170 other than the position right below the first semiconductor channel 102 and exposes the surface of the initial second semiconductor trap layer 180 other than the position right below the second semiconductor channel 112. In this embodiment, during patterning to form the first semiconductor channel 102 and the second semiconductor channel 112, the mask layer 119 located on top surfaces of the first semiconductor channel 102 and the second semiconductor channel 112 is not removed. Therefore, the mask layer 119 and the barrier layer 129 may be jointly used for protecting the first semiconductor channel 102 and the second semiconductor channel 112 in a subsequent annealing process to prevent materials of the first semiconductor channel 102 and the second semiconductor channel 112 from reacting with the metal material.

In other embodiments, in the operation, the mask layer located on the top surfaces of the first semiconductor channel and the second semiconductor channel may be removed, to expose the top surfaces of the first semiconductor channel and the second semiconductor channel, so that in subsequent operations of forming the bit line and the electrical contact layer, a first metal contact layer is formed on an end surface of the second doped region away from the semiconductor base, and a second metal contact layer is formed on an end surface of the fourth doped region away from the semiconductor base.

Referring to FIG. 8, a metal layer 139 is formed on surfaces of the initial first semiconductor trap layer 170 and the initial second semiconductor trap layer 180.

The metal layer 139 provides a metal element for subsequent formation of the bit line 101. The metal layer 139 is located on the surface of the initial first semiconductor trap layer 170 other than the position right below the first semiconductor channels 102, is located on the surface of the initial second semiconductor trap layer 180 other than the position right below the second semiconductor channels 112, and is further located on the surface of the barrier layer 129. The material of the metal layer 139 includes at least one of cobalt, nickel, molybdenum, titanium, tungsten, tantalum or platinum.

In other embodiments, when the mask layer located on the top surfaces of the first semiconductor channel and the second semiconductor channel is removed, the metal layer is in contact with an end surface exposed in the second doped region c and an end surface exposed in the fourth doped region f, so that in subsequent operations of forming the bit line and the electrical contact layer, the first metal contact layer may be formed on the end surface of the second doped region away from the semiconductor base and at the same time the second metal contact layer may be formed on the end surface of the fourth doped region away from the semiconductor base.

Referring to FIG. 8 and FIG. 9 in combination, annealing is performed to convert a partial thickness of the initial first semiconductor trap layer 170 into the bit line 101 and convert a partial thickness of the initial second semiconductor trap layer 180 into the electrical contact layer 111.

In an embodiment, in an annealing process, the metal layer 139 reacts with the partial thickness of the initial first semiconductor trap layer 170 and the partial thickness of the initial second semiconductor trap layer 180, to convert the partial thickness of the initial first semiconductor trap layer 170 into the bit line 101 and convert the partial thickness of the initial second semiconductor trap layer 180 into the electrical contact layer 111. The remaining initial first semiconductor trap layer 170 is used as the first semiconductor trap layer 120. The remaining initial second semiconductor trap layer 180 is used as the second semiconductor trap layers 130. In another embodiment, the complete thickness of the initial first semiconductor trap layer is converted into the bit line, and the complete thickness of the initial second semiconductor trap layer is converted into the electrical contact layer.

In addition, the initial first semiconductor trap layer 170 located right below the first semiconductor channel 102 may react with the metal layer 139, and the initial second semiconductor trap layer 180 located right below the second semiconductor channel 112 may also react with the metal layer 139, so that the material of the bit line 101 located right below the first semiconductor channel 102 is also a metal semiconductor compound, and the material of the electrical contact layer 111 located right below the second semiconductor channel 112 is also a metal semiconductor compound. In other embodiments, the material of the bit line located right below the first semiconductor channel may also be kept consistent with the material of the initial first semiconductor trap layer. The material of the electrical contact layer located right below the second semiconductor channel may also be kept consistent with the material of the initial second semiconductor trap layer.

Specifically, rapid thermal annealing is performed, and process parameters of the rapid thermal annealing include: the semiconductor structure is annealed in an $N_2$ atmosphere, and an annealing temperature is 300° C. to 500° C. Because the annealing temperature is moderate, this helps to enable the metal element in the metal layer 139 to fully diffuse into the initial first semiconductor trap layer 170 and the initial second semiconductor trap layer 180, to form the bit line 101 and the electrical contact layer 111 with relatively small resistivity. In addition, because the annealing temperature is moderate, this helps to prevent the metal element in the metal layer 139 from diffusing into the first channel region b and the second channel region e.

In addition, annealing is performed in an $N_2$ atmosphere. This helps to prevent the metal layer 139, the initial first semiconductor trap layer 170, and the initial second semiconductor trap layer 180 from being oxidized.

After the bit line 101 and the electrical contact layer 111 are formed, the barrier layer 129 and the remaining metal layer 139 are removed. Rapid thermal annealing is performed again, and process parameters of the rapid thermal annealing include: the semiconductor structure is annealed in an $N_2$ atmosphere, and an annealing temperature is 500° C. to 800° C. This helps to enable the metal element to fully react with the initial first semiconductor trap layer 170 and the initial second semiconductor trap layer 180, to ensure that the formed bit line 101 and electrical contact layer 111 have relatively small resistivity.

In other embodiments, after the bit line and the electrical contact layer are formed on the semiconductor base, the first semiconductor channel may be formed on the surface of the bit line away from the semiconductor base. The second semiconductor channel may be formed on the surface of the electrical contact layer away from the semiconductor base. The materials of the bit line and the electrical contact layer may be a metal material.

Referring to FIG. 9, a first dielectric layer 116 is formed. The first dielectric layer 116 is located on surfaces of the bit line 101 and the electrical contact layer 111 away from the semiconductor substrate 110.

Specifically, the first dielectric layer 116 is located on the surface of the isolation structure 140, the sidewall surface of the first doped region a (referring to FIG. 2), and the sidewall surface of the third doped region d (referring to FIG. 3), and is used for isolating the bit line 101 from a subsequently formed word line and isolating the electrical contact layer 111 from a subsequently formed gate. The first dielectric layer 116 is a whole film layer structure, and is used for preventing electrical interference between the bit line 101 and the subsequently formed word line and preventing electrical interference between the electrical contact layer 111 and the subsequently formed gate.

The operations of forming the first dielectric layer 116 includes: forming an initial first dielectric layer on the surfaces of the bit line 101 and the electrical contact layer 111 away from the semiconductor substrate 110; and planarizing and etching back the initial first dielectric layer to a preset thickness, to form the first dielectric layer 116.

Continuing to refer to FIG. 9, an initial gate dielectric layer 163 is formed. The initial gate dielectric layer 163 covers surfaces of the remaining first semiconductor channel 102 and the remaining second semiconductor channel 112, and is further located on the surface of the mask layer 119. The initial gate dielectric layer 163 prepares for subsequently forming a first gate dielectric layer and a second gate dielectric layer.

Subsequent operations include: forming a word line and a gate, the word line being disposed surrounding the first channel region, the gate being disposed surrounding the second channel region. The formation of a word line and a gate includes the following operations.

Figure 10:
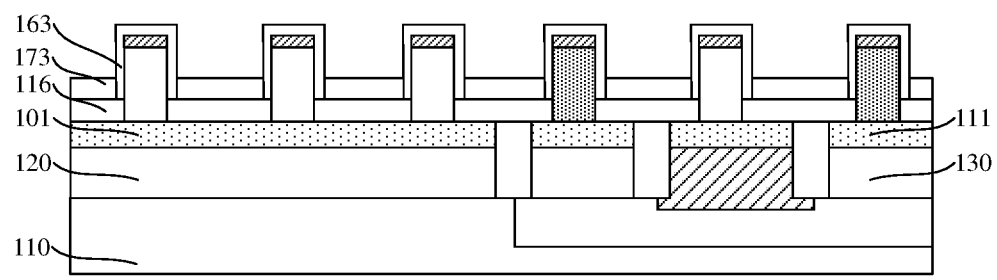

Referring to FIG. 10, an initial gate conductive layer 173 is formed on sidewall surfaces of the initial gate dielectric layers 163 corresponding to the first channel region b and the second channel region e, and the initial gate conductive layer 173 is a whole film layer structure.

Specifically, a method for forming the initial gate conductive layer 173 includes chemical vapor deposition, physical vapor deposition, atomic layer deposition or metal organic compound chemical vapor deposition.

Figure 11:
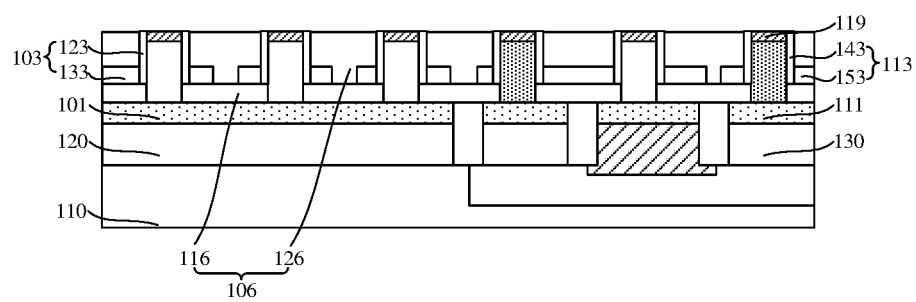

Referring to FIG. 10 and FIG. 11 in combination, the initial gate conductive layer 173 is patterned, to form the first gate conductive layers 133 that are at intervals from each other and second gate conductive layers 153 that are at intervals from each other.

It needs to be noted that to first gate conductive layers 133 of different first semiconductor channels 102 located on one same bit line 101 may be connected to different electric potentials, to implement diversified control of the first semiconductor channels 102. FIG. 11 illustrates that one second gate conductive layer 153 surrounds both a third semiconductor channel 122 (referring to FIG. 1) in an NMOS region and a fourth semiconductor channel 142 (referring to FIG. 1) in a PMOS region adjacent to the NMOS region. In another example, one second gate conductive layer may only surround a third semiconductor channel in the NMOS region, and another second gate conductive layer may only surround a fourth semiconductor channel in the PMOS region, Continuing to refer to FIG. 11, second dielectric layers 126 are formed. The second dielectric layers 126 are respectively located in an interval between adjacent first gate conductive layers 133, and in an interval between adjacent second gate conductive layers 153.

The second dielectric layers 126 are used for preventing electrical interference between adjacent first gate conductive layers 133, and preventing electrical interference between adjacent second gate conductive layers 153. The second dielectric layers 126 are further located on surfaces of the first gate conductive layer 133 and the second gate conductive layer 153 away from the semiconductor substrate 110 and are used for supporting other conductive structures subsequently formed on the surface of the second dielectric layer 126 away from the semiconductor substrate 110 and insulating the first gate conductive layer 133 and the second gate conductive layer 153 from other conductive structures.

Further, after the second dielectric layers 126 are formed, the second dielectric layers 126 and the initial gate dielectric layer 163 are planarized to expose the mask layer 119. The remaining initial gate dielectric layer 163 in the memory region II is used as the first gate dielectric layer 123, and the remaining initial gate dielectric layer 163 in the logical device region I is used as the second gate dielectric layer 143.

The first gate dielectric layer 123 and the first gate conductive layer 133 jointly form the word line 103. The second gate dielectric layer 143 and the second gate conductive layer 153 jointly form the gate 113.

In this embodiment, the first dielectric layers 116 and the second dielectric layers 126 jointly form the dielectric layers 106, and the material of the first dielectric layers 116 and the material of the second dielectric layers 126 are the same. This helps to reduce types of materials required in the manufacturing process of the semiconductor structure and reduce the costs and complexity of manufacturing the semiconductor structure.

Figure 12:
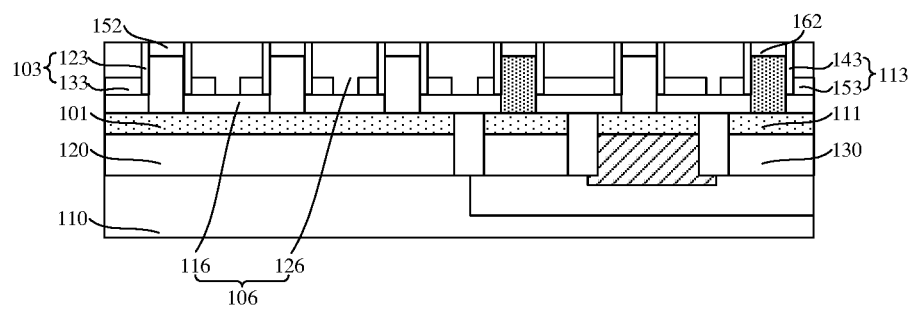

Referring to FIG. 11 and FIG. 12 in combination, the mask layer 119 is removed, to expose end surfaces of the second doped region c (referring to FIG. 2) and the fourth doped region f (referring to FIG. 3) away from the semiconductor substrate 110.

Further, an end surface of the second doped region c away from the semiconductor base 100 (referring to FIG. 1) and an end surface of the fourth doped region f away from the semiconductor base 100 are metallized. A partial thickness of the second doped region c is converted into a first metal contact layer 152. A partial thickness of the fourth doped region f is converted into a second metal contact layer 162. Materials of the first metal contact layer 152 and the second metal contact layer 162 are both metal semiconductor compounds.

Figure 13:
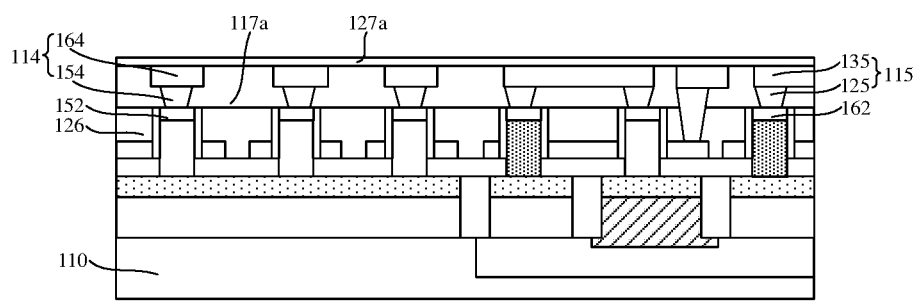

Referring to FIG. 13, a first interlayer dielectric layer 117a is formed on a surface jointly formed by a top surface of the first metal contact layer 152, a top surface of the second metal contact layer 162, and a top surface of the second dielectric layer 126. The first interlayer dielectric layer 117a is etched to form multiple first grooves. The first grooves are used for forming a first conductive structure 114 and a second conductive structure 115.

In this embodiment, each first groove is provided with a first opening and a second opening. In a plane perpendicular to the surface of the semiconductor substrate 110, the cross-sectional shape of the first opening is an inverted trapezoid with a decreasing width from top to bottom. The orthographic projection of the second opening onto the semiconductor substrate 110 covers the orthographic projection of the first opening onto the surface of the semiconductor substrate 110.

Each first groove is filled with a conductive material. The first conductive column 154 in the first conductive structure 114 or the second conductive column 125 in the second conductive structure 115 is formed in the first opening. The first conductive layer 164 in the first conductive structure 114 or the second conductive layer 135 in the second conductive structure 115 is formed in the second opening.

FIG. 13 illustrates that a single first opening in the memory region II (referring to FIG. 1) exposes one second doped region c and a single first opening in the logical device region I (referring to FIG. 1) may expose one fourth doped region f or may expose two fourth doped regions f. In this embodiment, the number of the second doped regions c exposed by the single first opening in the memory region II and the number of the fourth doped regions f exposed by the single first opening in the logical device region I can be appropriately set according to an actual electrical requirement.

Further, a first etching barrier layer 127*a* is formed on a surface jointly formed by the top surface of the first conductive structure 114, the top surface of the second conductive structure 115, and the top surface of the first interlayer dielectric layer 117*a*.

Figure 14:
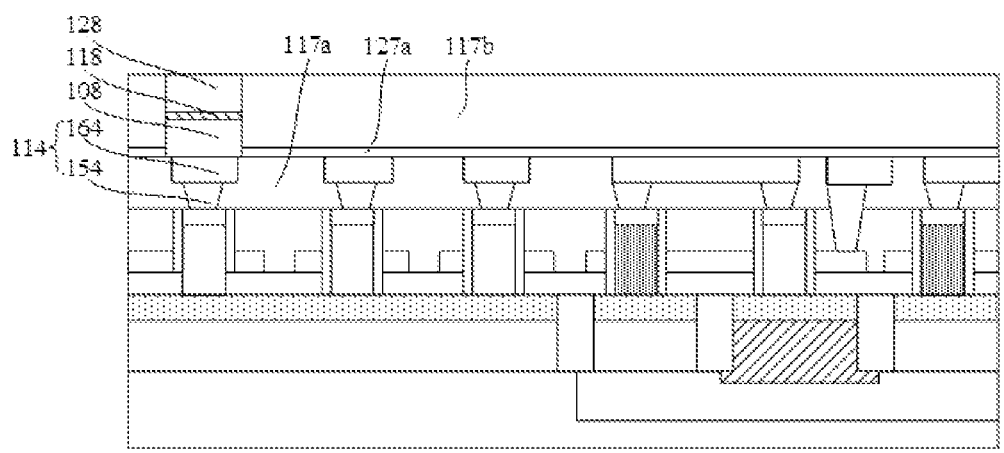

Referring to FIG. 14, a second interlayer dielectric layer 117*b* is formed on the top surface of the first etching barrier layer 127*a*. The second interlayer dielectric layer 117*b* is etched to form a second groove. The second groove is used for forming a free layer 108, a tunneling layer 118, and a pinned layer 128.

Specifically, the second groove exposes the top surface of the first conductive structure 114. The free layer 108, the tunneling layer 118, and the pinned layer 128 are sequentially stacked in the second groove.

Figure 15:
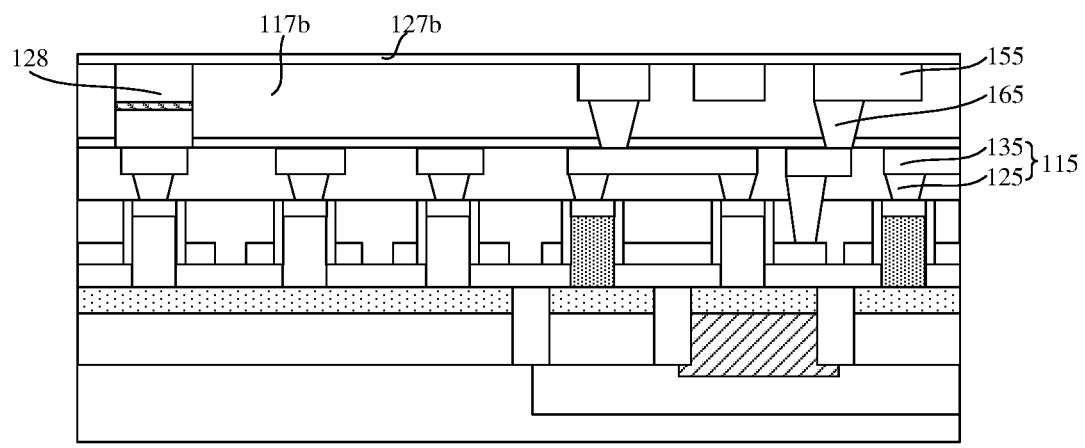

Referring to FIG. 15, the second interlayer dielectric layer 117*b* is etched again to form multiple third grooves. Each of some third grooves is provided with a third opening and a fourth opening. For morphological features of the third opening and the fourth opening, reference may be made to the foregoing first opening and second opening. Details are not described herein again. Some third grooves are only provided with the fourth opening. That is, these third grooves do not expose the second conductive structure 115.

Each third groove is filled with a conductive material. The third conductive column 165 in a third conductive structure 145 is formed in one third opening, and the third conductive layer 155 in the third conductive structure 145 is formed in the corresponding fourth opening.

Further, a second etching barrier layer 127*b* is formed on a surface jointly formed by the top surface of the second interlayer dielectric layer 117*b*, the top surface of the pinned layer 128, and the top surface of the third conductive layer 155.

Figure 16:
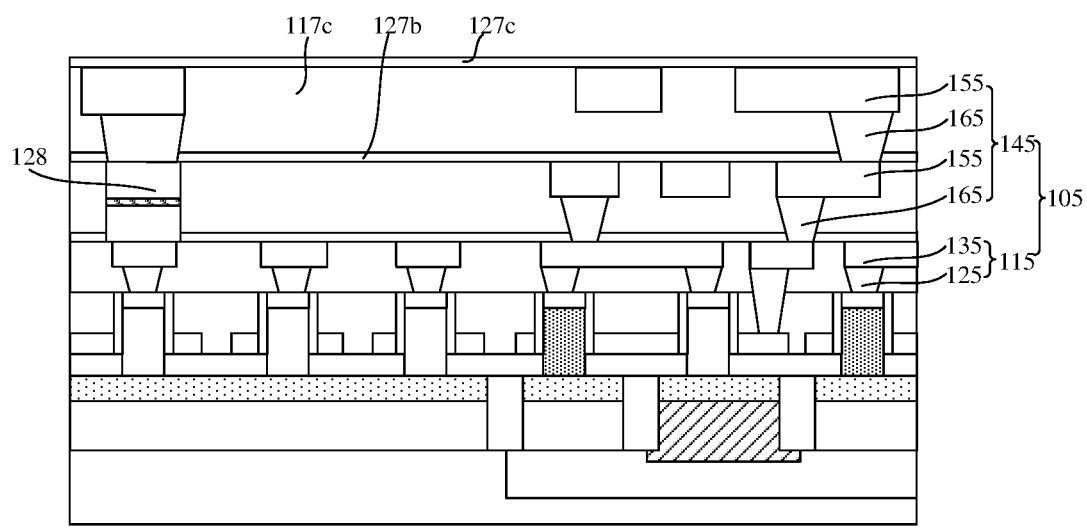

Referring to FIG. 16, a third interlayer dielectric layer 117*c* is formed on a top surface of the second etching barrier layer 127*b*. The third interlayer dielectric layer 117*c* is etched to form multiple fourth grooves. Each of some fourth grooves is provided with a fifth opening and a sixth opening. For morphological features of the fifth opening and the sixth opening, reference may be made to the foregoing first opening and second opening. Details are not described herein again. Some fourth grooves are only provided with the sixth opening. That is, the some of the fourth grooves do not expose the third conductive layer 155.

Each fourth groove is filled with a conductive material. Another layer of the third conductive column 165 in the third conductive structure 145 is formed in one fifth opening, and another layer of the third conductive layer 155 in the third conductive structure 145 is formed in the corresponding sixth opening.

It needs to be noted that in FIG. 16, it is taken as an example that the third conductive structure 145 includes two layers of the third conductive layers 155 and two layers of third conductive columns 165. The number of layers of third conductive layers 155 and the third conductive columns 165 included in the third conductive structure 145 can be appropriately set according to an actual electrical requirement. The second conductive structure 115 and the third conductive structure 145 jointly form an electrical connection structure 105.

Further, a third etching barrier layer 127*c* is formed on a surface jointly formed by the top surface of the third interlayer dielectric layer 117*c* and the top surface of the third conductive layer 155.

Figure 17:
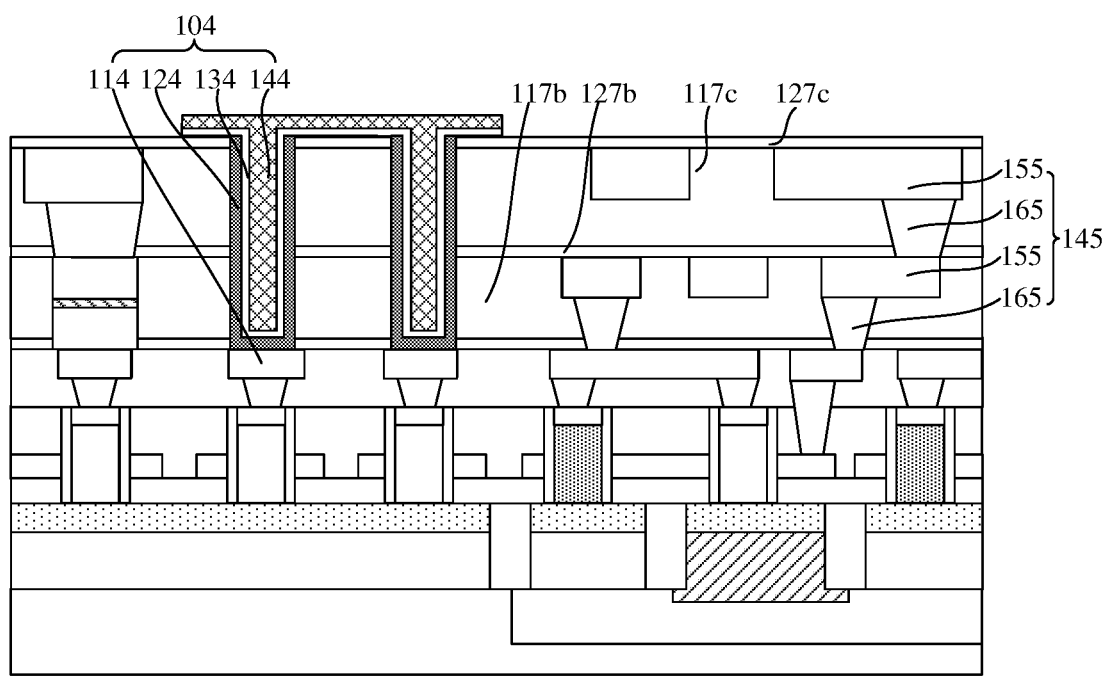

Referring to FIG. 16 and FIG. 17 in combination, the second interlayer dielectric layer 117*b*, the second etching barrier layer 127*b*, the third interlayer dielectric layer 117*c*, and the third etching barrier layer 127*c* are etched, to form a fifth groove. The fifth groove exposes the first conductive structure 114.

Further, a lower electrode layer 124 is formed. A lower electrode layer 124 is located on the bottom and sidewalls of the fifth groove.

Specifically, during the formation of the lower electrode layer 124, a part of the lower electrode layer 124 is formed on the surface of the third etching barrier layer 127*c* away from the semiconductor substrate 110. The part of lower electrode layer 124 located on the surface of the third etching barrier layer 127*c* away from the semiconductor substrate 110 is removed by a planarization or etching process.

Capacitor dielectric layer 134 is formed. The capacitor dielectric layer 134 covers the surface of the lower electrode layer 124 and the surface of the part of the third etching barrier layer 127*c* away from the semiconductor substrate 110, the capacitor dielectric layer 134 located in the fifth groove defines a through via.

An upper electrode layer 144 is formed. The upper electrode layer 144 is located on the surface of the capacitor dielectric layer 134 and fills the through via.

In this embodiment, the first conductive structure 114, the lower electrode layer 124, the capacitor dielectric layer 134, and the upper electrode layer 144 jointly form a capacitor structure 104.

In other embodiments, there is an interval between upper electrode layers located in adjacent through vias, so that adjacent upper electrode layers may be connected to different potentials. This helps to implement diversified control of adjacent capacitor structures. Alternatively, the capacitor structure may be a planar capacitor. The lower electrode layer, the capacitor dielectric layer, and the upper electrode layer are sequentially stacked in the fifth groove.

In this embodiment, in the direction perpendicular to the surface of the semiconductor base 100 (referring to FIG. 1), the depth of the lower electrode layers 124 is the same as the depth of the third conductive structure 145. In FIG. 17, it is taken as an example that the depth of the lower electrode layer 124 penetrates two third conductive layers 155. It needs to be noted that the number of the third conductive layers 155 penetrated by the depth of the lower electrode layer 124 can be appropriately set according to an actual electrical requirement.

Referring to FIG. 17 and FIG. 1 in combination, a fourth interlayer dielectric layer is formed on a surface jointly formed by the top surface of the third etching barrier layer 127*c* and top surface of the upper electrode layer 144. The fourth interlayer dielectric layer is etched to form a sixth groove. The sixth groove is filled with a conductive material, to form a fourth conductive layer 109.

In this embodiment, an insulating layer 107 includes the first interlayer dielectric layer 117*a*, the first etching barrier layer 127*a*, the second interlayer dielectric layer 117*b*, the second etching barrier layer 127*b*, the third interlayer dielectric layer 117*c*, the third etching barrier layer 127*c*, and the fourth interlayer dielectric layer.

In summary, the embodiments of the disclosure provide a method for manufacturing a semiconductor structure. A semiconductor base 100 including a logical device region I and a memory region II is designed. A structure in the memory region II is used for implementing data storage, and a structure in the logical device region I is used for implementing data computing, so that one same semiconductor structure is provided with both a processing unit and a memory, to implement IMC, thereby enabling an input/output process and a computing process of data to be performed in different regions of the semiconductor structure. This helps to shorten the distance between the processing unit and the memory, thereby improving the efficiency of data transfer and reducing power consumption required for data transfer. This helps to improve the operating efficiency of the semiconductor structure and reduce the operating energy consumption of the semiconductor structure.

A person of ordinary skill in the art may understand that the foregoing implementations are specific embodiments for implementing the disclosure, and in actual applications, various changes can be made thereto in forms and details without departing from the spirit and scope of the disclosure. Any person skilled in the art can make changes and modifications without departing from the spirit and scope of the disclosure, and the scope of protection of the disclosure should be as defined by the scope of the claims.

INDUSTRIAL APPLICABILITY

Embodiments of the disclosure provide a semiconductor structure and a method for manufacturing same. In the technical solution provided in the embodiments of the disclosure, a semiconductor base includes a logical device region and a memory region. A structure in the memory region is used for implementing data storage, and a structure in the logical device region is used for implementing data computing, so that one same semiconductor structure is provided with both a processing unit and a memory, to implement IMC. That is, a computing function is integrated in a special storage array (the logical device region) in the semiconductor structure, and a storage function is integrated in another storage array (memory region). When computing is required, the memory region in the semiconductor structure sends input data to the logical device region. After a certain number of clock periods, the logical device region returns a computing result to the memory region. Compared with the related art, in the embodiments of the disclosure, the processing unit and the memory are integrated into one large storage array, and an input/output process and a computing process of data are both performed in different regions of the storage array. This helps to shorten the distance between the processing unit and the memory, thereby improving the efficiency of data transfer and reducing power consumption required for data transfer. This helps to improve the operating efficiency of the semiconductor structure and reduce the operating energy consumption of the semiconductor structure.

The invention claimed is:

1. A semiconductor structure, comprising:
    a semiconductor base, comprising a logical device region and a memory region;
    a bit line and an electrical contact layer disposed in a same layer as the bit line, the bit line being located on the semiconductor base in the memory region, the electrical contact layer being located on the semiconductor base in the logical device region;
    a first semiconductor channel, located on a surface of the bit line, in a direction from the semiconductor base to the bit line, the first semiconductor channel comprising a first doped region, a first channel region and a second doped region that are sequentially arranged, the first doped region being in contact with the bit line;
    a second semiconductor channel, disposed in a same layer as the first semiconductor channel, and located on a surface of the electrical contact layer, in a direction from the semiconductor base to the electrical contact layer, the second semiconductor channel comprising a third doped region, a second channel region and a fourth doped region that are sequentially arranged, the third doped region being in contact with the electrical contact layer;
    a word line and a gate disposed in a same layer as the word line, the word line being disposed surrounding the first channel region, the gate being disposed surrounding the second channel region;
    a capacitor structure, located on a side of the second doped region away from the first channel region, and in contact with the second doped region;
    an electrical connection structure, located on a side of the fourth doped region away from the second channel region, and in contact with the fourth doped region; and
    a dielectric layer, located between the bit line and the word line, and further located on a side of the word line away from the semiconductor base.

2. The semiconductor structure according to claim 1, wherein the semiconductor base comprises:
    a semiconductor substrate;
    a first semiconductor trap layer, disposed on the semiconductor substrate in the memory region, the bit line being located on a surface of the first semiconductor trap layer away from the semiconductor substrate; and
    a second semiconductor trap layer, disposed on the semiconductor substrate in the logical device region, the electrical contact layer being located on a surface of the second semiconductor trap layer away from the semiconductor substrate.

3. The semiconductor structure according to claim 2, wherein an orthographic projection of the first semiconductor trap layer onto the semiconductor substrate coincides with an orthographic projection of the bit line onto the semiconductor substrate.

4. The semiconductor structure according to claim 2, wherein the logical device region comprises a n-type metal-oxide semiconductor (NMOS) region and a p-type metal-oxide semiconductor (PMOS) region; and the semiconductor base in the logical device region further comprises: an isolation structure, located between two adjacent ones of second semiconductor trap layers, and further located between two adjacent ones of electrical contact layers.

5. The semiconductor structure according to claim 1, wherein the bit line and the first semiconductor channel have a same first semiconductor element, a resistivity of the bit line is less than a resistivity of the first doped region, the electrical contact layer and the second semiconductor channel have a same second semiconductor element, and a resistivity of the electrical contact layer is less than a resistivity of the third doped region.

6. The semiconductor structure according to claim 5, wherein a material of the electrical contact layer is the same as a material of the bit line.

7. The semiconductor structure according to claim 6, wherein the material of the bit line comprises a metal semiconductor compound;
the first semiconductor element comprises at least one of silicon, carbon, germanium, arsenic, gallium or indium; and a metal element in the metal semiconductor compound comprises at least one of cobalt, nickel, molybdenum, titanium, tungsten, tantalum or platinum; and
the second doped region comprises: a first metal contact layer, in contact with the capacitor structure, a resistivity of the first metal contact layer being less than a resistivity of the second doped region other than the first metal contact layer; and
the fourth doped region comprises: a second metal contact layer, located in a same layer as the first metal contact layer, the second metal contact layer being in contact with the electrical connection structure, a resistivity of the second metal contact layer being less than a resistivity of the fourth doped region other than the second metal contact layer.

8. The semiconductor structure according to claim 1, wherein the first semiconductor channel constitutes a channel of a first junctionless transistor; and the second semiconductor channel constitutes a channel of a second junctionless transistor.

9. The semiconductor structure according to claim 8, wherein the first doped region, the first channel region and the second doped region have a same type of doped ions; and the third doped region, the second channel region and the fourth doped region have a same type of doped ions.

10. The semiconductor structure according to claim 1, wherein the word line comprises:
a first gate dielectric layer, disposed surrounding the first channel region, located on a first sidewall surface of the first semiconductor channel in which the first channel region is located, and further located on a second sidewall surface of the first semiconductor channel in which the second doped region is located; and
a first gate conductive layer, disposed surrounding the first channel region, and located on a sidewall surface of the first gate dielectric layer corresponding to the first channel region.

11. The semiconductor structure according to claim 10, wherein the gate comprises:
a second gate dielectric layer, located in a same layer as the first gate dielectric layer, disposed surrounding the second channel region, located on a first sidewall surface of the second semiconductor channel in which the second channel region is located, and further located on a second sidewall surface of the second semiconductor channel in which the fourth doped region is located; and
a second gate conductive layer, located in a same layer as the first gate conductive layer, disposed surrounding the second channel region, and located on a sidewall surface of the second gate dielectric layer corresponding to the second channel region.

12. The semiconductor structure according to claim 1, wherein the memory region comprises a dynamic random access memory (DRAM) region, and the capacitor structure of the DRAM region comprises: a first conductive structure, in contact with the second doped region; a lower electrode layer, in contact with the first conductive structure; a capacitor dielectric layer, located on a surface of the lower electrode layer; and an upper electrode layer, located on a surface of the capacitor dielectric layer; and
the electrical connection structure comprises: a second conductive structure, located in a same layer as the first conductive structure, the second conductive structure being in contact with the fourth doped region; and a third conductive structure, in contact with a side of the second conductive structure away from the fourth doped region.

13. The semiconductor structure according to claim 12, wherein in a direction perpendicular to a surface of the semiconductor base, a depth of the lower electrode layer is the same as a depth of the third conductive structure.

14. The semiconductor structure according to claim 1, further comprising: an insulating layer, located on a surface of the dielectric layer, the capacitor structure and the electrical connection structure being located in the insulating layer, and a relative dielectric constant of a material of the insulating layer being less than a relative dielectric constant of a material of the dielectric layer.

15. The semiconductor structure according to claim 12, wherein the memory region further comprises a non-volatile memory (NVM) region; and the semiconductor structure further comprises: a free layer, a tunneling layer, and a pinned layer stacked on the second doped region of the NVM region, and the free layer is electrically connected to the second doped region of the NVM region.

16. A method for manufacturing a semiconductor structure, comprising:
providing a semiconductor base, the semiconductor base comprising a logical device region and a memory region;
forming a bit line and an electrical contact layer disposed in a same layer as the bit line, the bit line being located on the semiconductor base in the memory region, the electrical contact layer being located on the semiconductor base in the logical device region;
forming a first semiconductor channel and a second semiconductor channel disposed in a same layer as the first semiconductor channel, the first semiconductor channel being located on a surface of the bit line, in a direction from the semiconductor base to the bit line, the first semiconductor channel comprising a first doped region, a first channel region, and a second doped region that are sequentially arranged, the first doped region being in contact with the bit line, the second semiconductor channel being located on a surface of the electrical contact layer, in a direction from the semiconductor base to the electrical contact layer, the second semiconductor channel comprising a third doped region, a second channel region, and a fourth doped region that are sequentially arranged, the third doped region being in contact with the electrical contact layer;

forming a word line and a gate disposed in a same layer as the word line, the word line being disposed surrounding the first channel region, the gate being disposed surrounding the second channel region;

forming a capacitor structure, located on a side of the second doped region away from the first channel region, the capacitor structure being in contact with the second doped region;

forming an electrical connection structure, the electrical connection structure being located on a side of the fourth doped region away from the second channel region, the electrical connection structure being in contact with the fourth doped region; and forming a dielectric layer, the dielectric layer being located between the bit line and the word line, and being further located on a side of the word line away from the semiconductor base.

17. The method according to claim 16, wherein providing the semiconductor base and forming the bit line, the electrical contact layer, the first semiconductor channel and the second semiconductor channel comprise:

providing an initial semiconductor base;

patterning a partial thickness of the initial semiconductor base, to form the first semiconductor channel and the second semiconductor channel; and metallizing a remaining partial thickness of the initial semiconductor base, to convert a partial thickness of the initial semiconductor base located below the first semiconductor channel into the bit line and convert a partial thickness of the initial semiconductor base located below the second semiconductor channel into the electrical contact layer, and a remaining part of the initial semiconductor base serving as the semiconductor base.

18. The method according to claim 17, wherein the initial semiconductor base comprises a semiconductor substrate, an initial first semiconductor trap layer and an initial second semiconductor trap layer, the initial first semiconductor trap layer is located on the semiconductor substrate in the memory region, and the initial second semiconductor trap layer is located on the semiconductor substrate in the logical device region;

patterning the partial thickness of the initial semiconductor base comprises: patterning a partial thickness of the initial first semiconductor trap layer and a partial thickness of the initial second semiconductor trap layer, to form the first semiconductor channel and the second semiconductor channel; and metallizing the remaining partial thickness of the initial semiconductor base comprises:

metallizing a remaining partial thickness of the initial first semiconductor trap layer and a remaining partial thickness of the initial second semiconductor trap layer.

19. The method according to claim 18, wherein a process of the metallization comprise:

forming a barrier layer, the barrier layer covering sidewall surfaces of the first semiconductor channel and the second semiconductor channel;

forming a metal layer on surfaces of the initial first semiconductor trap layer and the initial second semiconductor trap layer;

performing annealing to convert the partial thickness of the initial first semiconductor trap layer into the bit line and convert the partial thickness of the initial second semiconductor trap layer into the electrical contact layer; and after the bit line and the electrical contact layer are formed, removing the barrier layer and a remaining part of the metal layer.

20. The method according to claim 16, further comprising: metallizing an end surface of the second doped region away from the semiconductor base and an end surface of the fourth doped region away from the semiconductor base, to convert a partial thickness of the second doped region to a first metal contact layer, and convert a partial thickness of the fourth doped region to a second metal contact layer, and materials of the first metal contact layer and the second metal contact layer respectively being a metal semiconductor compound.

* * * * *